United States Patent
Toh et al.

(10) Patent No.: US 9,570,138 B2
(45) Date of Patent: Feb. 14, 2017

(54) MAGNETIC MEMORY CELLS WITH FAST READ/WRITE SPEED

(71) Applicant: GLOBALFOUNDRIES Singapore Pte. Ltd., Singapore (SG)

(72) Inventors: Eng Huat Toh, Singapore (SG); Vinayak Bharat Naik, Singapore (SG); Chenchen Jacob Wang, Singapore (SG); Kiok Boone Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/012,736

(22) Filed: Feb. 1, 2016

(65) Prior Publication Data

US 2016/0225429 A1   Aug. 4, 2016

Related U.S. Application Data

(60) Provisional application No. 62/111,115, filed on Feb. 3, 2015.

(51) Int. Cl.
  *G11C 11/16*   (2006.01)
  *H01L 27/22*   (2006.01)
  (Continued)

(52) U.S. Cl.
  CPC ............ *G11C 11/1675* (2013.01); *G11C 11/16* (2013.01); *G11C 11/1659* (2013.01);
  (Continued)

(58) Field of Classification Search
  CPC .............................. G11C 11/16; G11C 11/1675
  (Continued)

(56) References Cited

U.S. PATENT DOCUMENTS

| | | | |
|---|---|---|---|
| 2007/0159876 A1* | 7/2007 | Sugibayashi | G11C 11/16 365/158 |
| 2008/0229269 A1* | 9/2008 | Lamorey | G11C 14/0081 716/126 |

(Continued)

OTHER PUBLICATIONS

Joel Hruska, "Toshiba wants to reshape the chip industry with new low-power tunnel FETs', $2 billion investment", "http://www.extremetech.com/computing/189757-toshiba-wants-to-reshape-the-chip-industry-with-new-low-power-tunnel-fets-2-billion-investment", Sep. 2014, ExtremeTech.

(Continued)

*Primary Examiner* — Michael Tran
(74) *Attorney, Agent, or Firm* — Horizon IP Pte. Ltd.

(57) ABSTRACT

Memory cells and methods for forming a memory cell are presented. The memory cell includes a storage unit and a selector unit. The storage unit includes a magnetic storage element with first and second storage terminals and a bitline coupled to the second storage terminal. The selector unit includes a first selector and a second selector. The first selector may be a tunneling select transistor or a metal oxide semiconductor select transistor. The second tunneling select transistor is configured to have a second unidirectional current flow between its source and drain terminals. The second selector serves at least as a read selector for read operations of the memory cell and a read current is in the direction of the second unidirectional current flow between the source drain terminals of the second selector.

20 Claims, 38 Drawing Sheets

(51) Int. Cl.
*H01L 43/02* (2006.01)
*H01L 43/08* (2006.01)
*H01L 43/12* (2006.01)

(52) U.S. Cl.
CPC ........ *G11C 11/1673* (2013.01); *H01L 27/228* (2013.01); *H01L 43/02* (2013.01); *H01L 43/08* (2013.01); *H01L 43/12* (2013.01)

(58) Field of Classification Search
USPC ................................................ 365/158, 173
See application file for complete search history.

(56) References Cited

U.S. PATENT DOCUMENTS

| | | | | |
|---|---|---|---|---|
| 2009/0323403 | A1* | 12/2009 | Chen | G11C 11/16 365/158 |
| 2011/0069534 | A1* | 3/2011 | Inaba | G11C 7/18 365/158 |
| 2011/0298067 | A1* | 12/2011 | Ishiwata | G11C 11/16 257/421 |
| 2012/0099363 | A1* | 4/2012 | Inaba | G11C 13/0004 365/148 |
| 2013/0028015 | A1* | 1/2013 | Matsui | G11C 11/161 365/173 |
| 2013/0286721 | A1* | 10/2013 | Jung | G11C 11/1673 365/158 |
| 2014/0050009 | A1* | 2/2014 | Abedifard | G11C 8/16 365/148 |
| 2014/0112066 | A1* | 4/2014 | Chow | G11C 11/16 365/158 |
| 2015/0043272 | A1* | 2/2015 | Zhou | G11C 5/063 365/158 |
| 2015/0092479 | A1* | 4/2015 | Dong | G11C 7/1075 365/158 |

OTHER PUBLICATIONS

Y. Kondo et al., "Novel Device Architecture Proposal of Source Junctionless Tunneling Field-Effect Transistor (SJL-TFET)", Sep. 2014, pp. 826-827, International Conference of Solid State Device & Materials, Tsukuba.

Daniel H. Morris et al., "Design of Low Voltage Tunneling-FET Logic Circuits Considering Asymmetric Conduction Characteristics", Journal on Emerging and Selected Topics in Circuits and Systems, 2014, IEEE.

M. Goto et al., The Guideline of Si/SiGe Hetero-Junction Design in Parallel Plate Style TFETs (PP-TFETs) for Si CMOS Platform Implementation, 2014, pp. 852-853, International Conference on Solid State Devices and Materials.

Business Wire, "Toshiba Develops Tunneling Field Effect Transistors for Ultra-Low Power MCU", "http://www.businesswire.com/news/home/20140911005210/en/Toshiba-Develops-Tunneling-Field-Effect-Transistors-Ultra-Low#.VEnsdxA4Sd4", Sep. 2014, Toshiba Corporation, Semiconductor & Storage Products Company.

Richard Chirgwin, "Toshiba plans chippery with mere 0.5V power slurp by 2017", "Tunnel field-effect transistors burrow through battery life barriers", "http://www.theregister.co.uk/2014/09/10/toshiba_plans_ultralowpower_tfet_by_2017/", Sep. 2014, The Register.

* cited by examiner

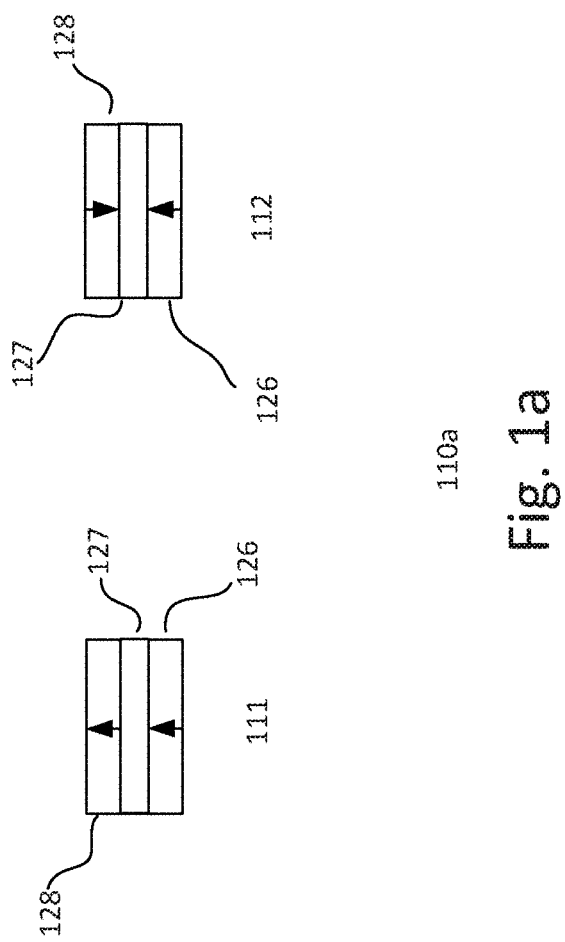

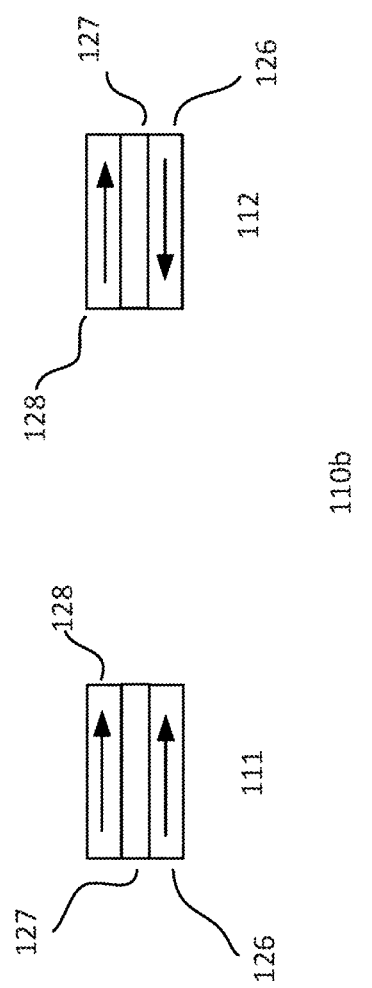

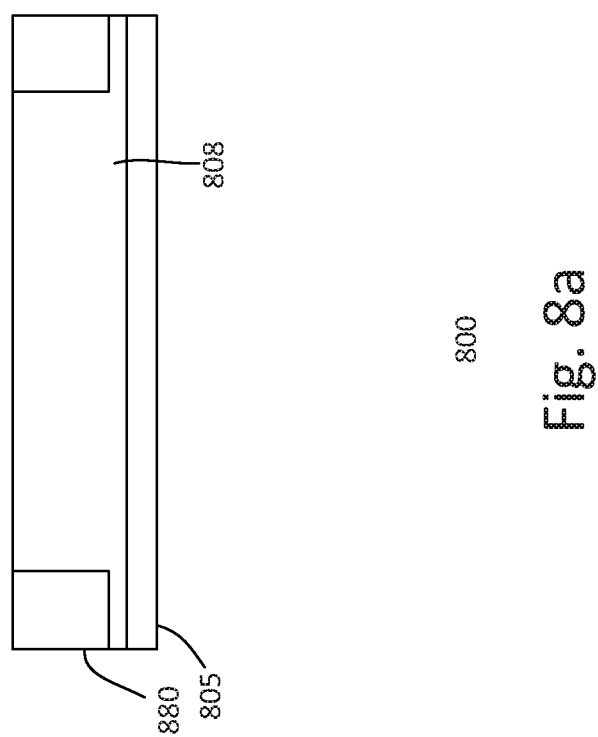

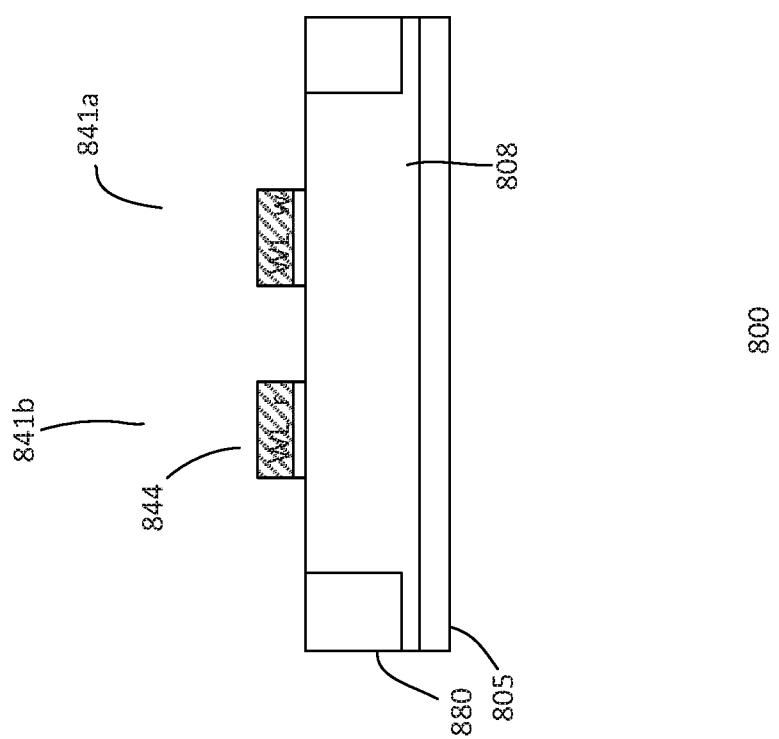

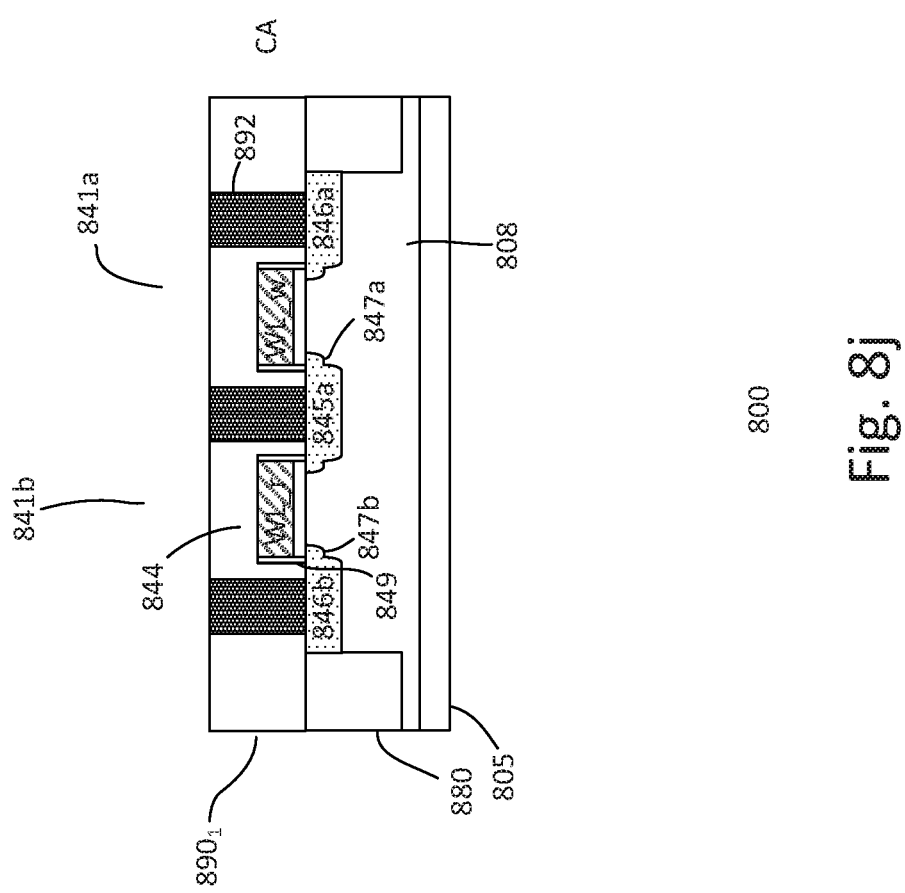

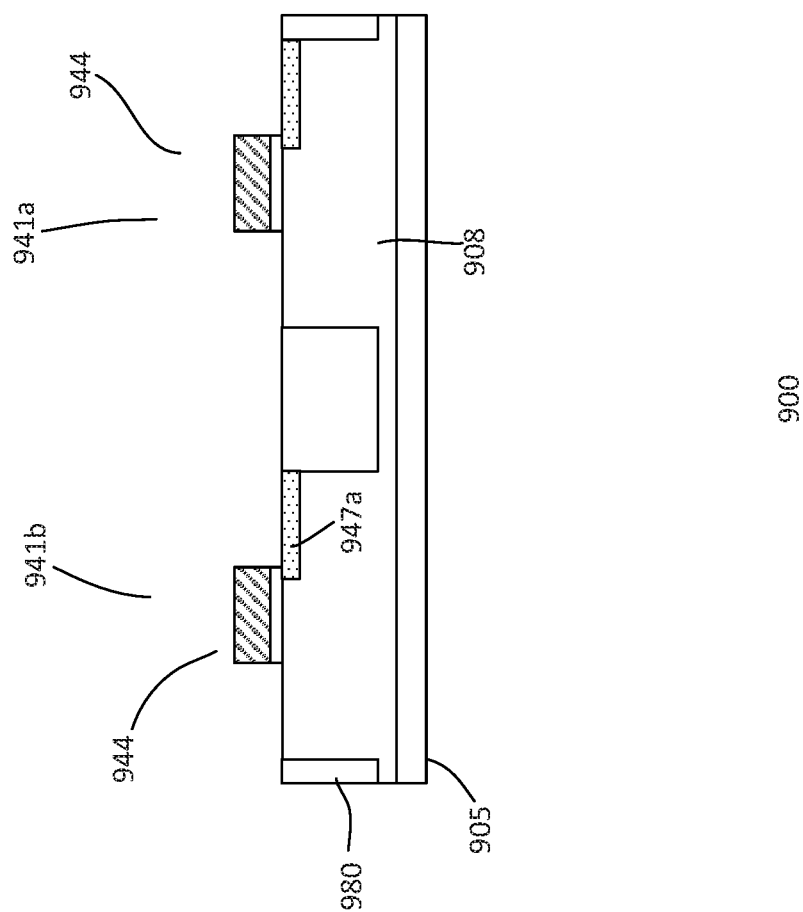

MAGNETIC MEMORY CELLS WITH FAST READ/WRITE SPEED

CROSS-REFERENCE TO RELATED APPLICATION

This application claims the benefit of U.S. Provisional Application Ser. No. 62/111,115, filed on Feb. 3, 2015, which is herein incorporated by reference in its entirety for all purposes.

BACKGROUND

A magnetic memory cell stores information by changing electrical resistance of a magnetic tunnel junction (MTJ) element. The MTJ element typically includes a fixed (pinned) magnetic layer and a free magnetic layer. The fixed (pinned) magnetic layer and the free magnetic layer are laminated such that a tunnel barrier film is formed between the two layers. Magnetic orientation of the free layer flips by a direction or an opposite direction of electric currents exceeding a critical select current. The electrical resistance of the MTJ element changes corresponding to that of the magnetic orientation of the free layer relating to the fixed (pinned) magnetic layer, which may be in either a parallel state or an anti-parallel state.

Magnetic memory cells require a high write current to improve write speed for programming and a low read current distribution for better read margin stability. However, conventional magnetic memory cells have high read current distributions, resulting in poor read margins, leading to a read error.

From the foregoing discussion, it is desirable to provide low power magnetic memory cells with high read/write speed and smaller read/write current variation.

SUMMARY

Embodiments of the present disclosure generally relate to memory devices and methods for forming a memory device. In one embodiment, a memory cell is presented. The memory cell includes a storage unit and a selector unit. The storage unit includes a magnetic storage element with first and second storage terminals and a bitline coupled to the second storage terminal. The selector unit includes a first selector and a second selector. The first selector has a first select transistor having a first drain terminal, a first source terminal and a first control terminal. The first drain terminal is coupled to the first storage terminal, the first source terminal is coupled to a source line, and the first control terminal is coupled to a first control wordline. The second selector has a second select transistor which is a second tunneling select transistor having a second drain terminal, a second source terminal and a second control terminal. The second drain terminal is coupled to the first storage terminal, the second source terminal is coupled to the source line and the second control terminal is coupled to a second control wordline. The second tunneling select transistor is configured to have a second unidirectional current flow between the second source and second drain terminals. The second selector serves at least as a read selector for read operations of the memory cell and a read current is in the direction of the second unidirectional current flow between the second source and second drain terminals.

In another embodiment, a method of forming a device is disclosed. The method includes providing a substrate. The substrate is defined with a cell region. A selector unit is formed in the cell region. Forming the selector unit includes forming first and second transistors of the selector unit in the cell region. The first selector is a first select transistor having a first drain region, a first source region and a first gate. The second selector is a second select transistor which is a second tunneling select transistor having a second drain region, a second source region and a second gate. The second tunneling select transistor is configured to have a second unidirectional current flow between the second source region and second drain region. The second selector serves at least as a read selector for read operations of a memory cell and the read current is in the direction of the second unidirectional current flow between the second source region and second drain region. A storage unit is formed in a backend dielectric layer. Forming the storage unit includes forming a magnetic storage element with first and second storage terminals. The first storage terminal is electrically coupled to the first and second drain regions. Source lines are formed in the backend dielectric layer coupled to the first and second source regions. A first control signal is coupled to the first gate and a second control signal is coupled to the second gate. A bitline is formed in the backend dielectric layer. The bitline is coupled to the second storage terminal.

In yet another embodiment, a method of forming a device is disclosed. The method includes providing a substrate. The substrate is defined with a cell region. A selector unit is formed in the cell region. Forming the selector unit includes forming first and second transistors of the selector unit in the cell region. The first selector is a first select transistor which is a first tunneling transistor having a first drain region, a first source region and a first gate. The first tunneling select transistor is configured to have a first unidirectional current flow between the first source region and first drain region. The second selector is a second select transistor which is a second tunneling select transistor having a second drain region, a second source region and a second gate. The second tunneling select transistor is configured to have a second unidirectional current flow between the second source region and second drain region. The second unidirectional current flow is in an opposite direction between the source region and drain region than the first unidirectional current flow. A storage unit is formed in a backend dielectric layer. Forming the storage unit includes forming a magnetic storage element with first and second storage terminals. The first storage terminal is electrically coupled to the first and second drain regions. Source lines are formed in the backend dielectric layer coupled to the first and second source regions. A first control signal coupled to the first gate and a second control signal coupled to the second gate are formed. A bitline is formed in the backend dielectric layer. The bitline is coupled to the second storage terminal.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 1a-1b show various diagrams of parallel and anti-parallel states of a magnetic tunneling junction (MTJ) element;

FIGS. 9a-9h show cross-sectional views of another embodiment of a process for forming a device.

DETAILED DESCRIPTION

Figure 2A:
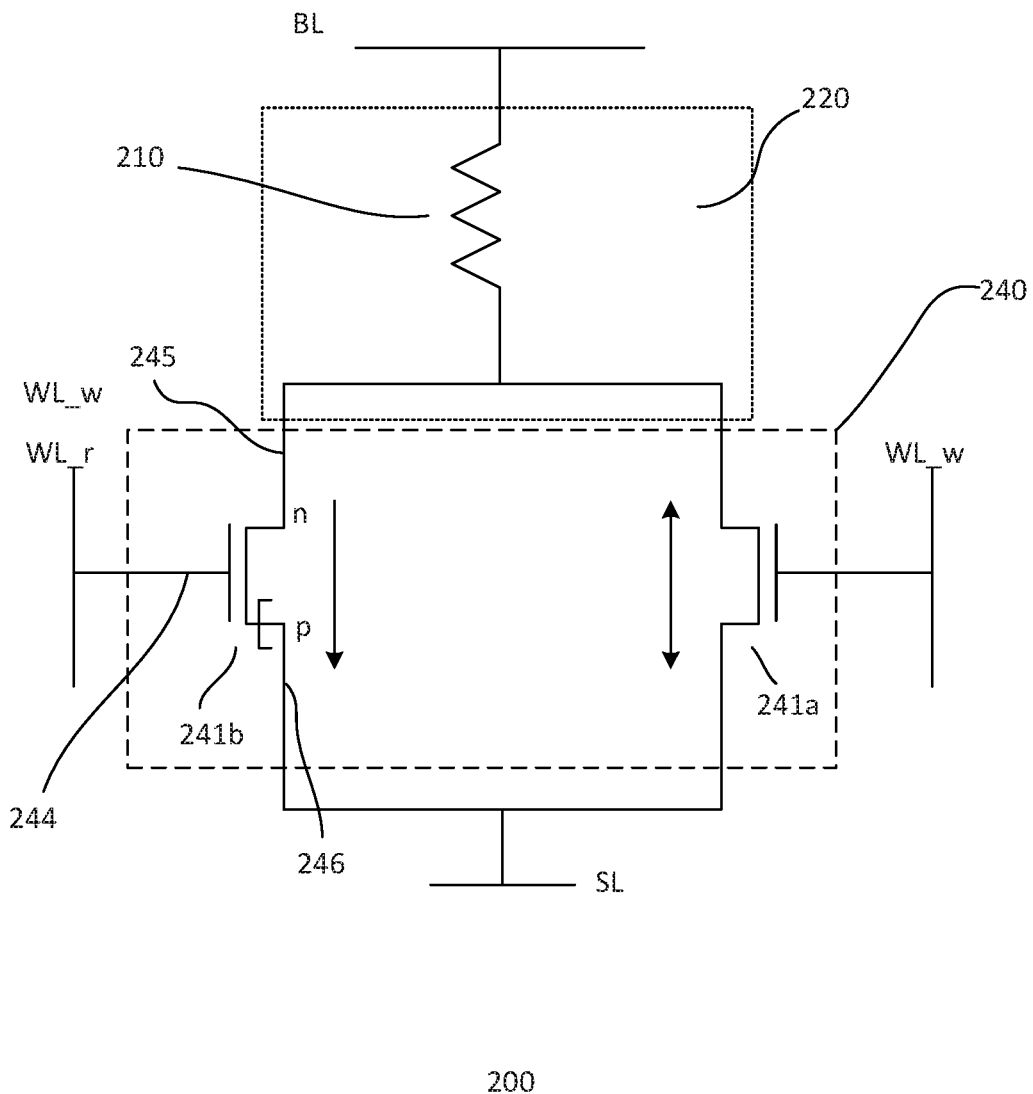
FIGS. 2a-2d show schematic diagrams of various embodiments of a memory cell.

Embodiments of the present disclosure generally relate to memory cells. In one embodiment, the memory cells are magnetic resistive memory cells, such as magnetic random access memory (MRAM). Magnetic resistive memory cells include magnetic tunneling junction (MTJ) elements. Other suitable types of resistive memory cells may also be useful. The memory cells are configured to produce high read/write speed with smaller read/write current variation and are energy efficient. The memory cells can be incorporated into or used with, for example, electronic products such as mobile phones, smart cards, mass storage, enterprise storage and industrial and automotive products.

FIG. 1a shows a simplified cross-sectional view of an embodiment of a MTJ element 110a. As shown, the magnetization or magnetic orientations of the magnetic element are configured to be in a perpendicular or vertical direction. Perpendicular direction, for example, refers to a direction which is perpendicular to a substrate surface. A MTJ element includes a magnetically fixed (pinned) layer 126, a tunneling barrier layer 127 and a magnetically free layer 128. The magnetic orientation of the fixed layer is fixed while the magnetic orientation of the free layer may be programmed to be in a first or same direction as the fixed layer or in a second or opposite direction as the fixed layer. For example, as shown by structure 111, the magnetic direction of the free layer is programmed to be in a first or parallel direction as the fixed layer. The corresponding MTJ electrical resistance between the free layer 128 and the fixed layer 126 is denoted as RP. Structure 112 illustrates that the magnetization of the free layer is programmed to be in a second or an anti-parallel direction as the fixed layer. The corresponding MTJ electrical resistance between the free layer 128 and the fixed layer 126 is denoted as $R_{AP}$. The resistance $R_{AP}$ is higher than the resistance RP. By way of example, the free layer and the fixed or reference layer may be CoFeB or CoFe based composite material and the tunneling barrier layer may be MgO or $Al_2O_3$. The MTJ stack may include other layers as well. Other suitable materials for the MTJ stack may also be useful.

FIG. 1b shows magnetic orientations in the magnetic layers of a MTJ element 110b in a horizontal direction. Horizontal direction, for example, refers to a direction which is parallel to the surface of a substrate surface or in-plane with the magnetic layers. As shown in FIG. 1b, the MTJ element 110b includes a fixed (pinned) layer 126, a barrier layer 127 and a free layer 128. When the MTJ element 110b is in a magnetic parallel state, magnetic orientations of the free layer 128 and the fixed layer 126 are in the same direction as shown by structure 111. The corresponding MTJ electrical resistance between the free layer 128 and the fixed layer 126 is denoted as RP. When the MTJ element 110b is in a magnetic anti-parallel state, magnetic orientations of the free layer 128 and the fixed layer 126 are in opposite directions, as shown by structure 112. The corresponding MTJ electrical resistance between the free layer 128 and the fixed layer 126 is denoted as RAP.

As shown in FIGS. 1a-1b, the MTJ stacks are bottom pinned stacks. For example, in a bottom pinned stack, the fixed layer is disposed below the free layer. In other embodiments, the MTJ stacks may be top pinned MTJ stacks. For example, the fixed layer may be disposed above the free layer.

FIGS. 2a-2d show schematic diagrams of different embodiments of a memory cell 200. The memory cell is a non-volatile memory cell. For example, the memory cell may be a magnetic memory cell. In one embodiment, the memory cell is a Spin Transfer Torque-Magnetic Random Access Memory (STT-MRAM) cell. Other suitable types of memory cells may also be useful. The memory cell includes a storage unit 220 and a cell selector unit 240. The storage unit is coupled to the cell selector unit. The storage unit 220, in one embodiment, includes a storage element 210. The storage element, for example, may be a resistive storage element. In one embodiment, the storage element is a magnetic resistive memory storage element, such as a MTJ storage element. The MTJ element may include MTJ elements such as those described in FIGS. 1a-1b. Other suitable types of MTJ or resistive storage elements may also be useful.

In one embodiment, the MTJ element is a bottom pinned perpendicular MTJ element. Other types of MTJ elements, such as horizontal or top pinned MTJ elements may also be useful. The top of the MTJ stack is coupled to a bitline BL while the bottom of the MTJ stack is coupled to the selector unit. In some cases, the MTJ element may include top and/or bottom electrodes (not shown). For example, the top electrode is disposed over the top of the MTJ element and the bottom electrode is disposed below the MTJ stack. The electrodes may be Ta or TaN electrodes. Other types of electrodes may also be useful. In such cases, the top electrode is coupled to a bitline BL of the memory cell while the bottom electrode is coupled to the selector unit.

As for the cell selector unit 240, it includes first and second selectors or selector subunits 241a-241b. The first selector subunit 241a, for example, may be a write selector and the second selector subunit 241b may be a read selector. In one embodiment, the second selector subunit 241b is a read/write selector unit. A selector subunit includes a select transistor. For example, the first selector subunit includes a first select transistor and the second selector subunit includes a second select transistor. A select transistor of a subunit is, for example, field effect transistor (FET).

A select transistor, as shown, includes a gate or control terminal 244 between first and second source/drain (S/D) terminals 245 and 246. The S/D terminals 245 and 246 are formed by, for example, heavily doped regions. One of the S/D terminal is coupled to the MTJ element while the other S/D terminal is coupled to the SL. The terminal coupled to the MTJ element may be referred to as a drain terminal and the terminal coupled to the SL may be referred to as a source terminal. For example, the first S/D terminal 245 may be referred to as a drain terminal and the second S/D terminal 246 may be referred to as a source terminal. As shown, the drain terminals of the select transistors are commonly coupled to the MTJ element. For example, the drain terminals are coupled to the bottom electrode of the MTJ element. The source terminals of the select transistors are commonly coupled to the source line SL of the memory cell.

In one embodiment, at least one of the selectors includes a tunneling FET (TFET). In one embodiment, at least the read selector includes a TFET. For example, the second or read selector includes a TFET. The TFET may be any type of TFET. For example, the TFET may be a pin (p-type, intrinsic, n-type) TFET. Other suitable types of TFETs, such as strained TFET, heterojunction TFET, pnpn TFET, symmetrical TFET, may also be used. For a TFET, the S/D terminals are heavily doped with opposite type polarity dopants and separated by an intrinsic or lower doped region. The symbol [ in the drawings corresponds to the p-type doped S/D terminal while the other is a n-type S/D terminal. A TFET is unidirectional. For example, current path between the S/D terminals flows in a single direction. In one embodiment, the direction of current flow is from the n terminal to the p terminal.

As for the write selector, it includes a metal oxide semiconductor (MOS) FET. Unlike TFET, the S/D regions of the MOS FET are heavily doped with the same polarity type doped regions. Also, unlike a TFET, the current flow is bi-directional. The current can flow from the first S/D terminal to the second S/D terminal or vice-versa, depending on the potential between the terminals. The current flows from high to low potential. For example, if the first S/D terminal has a higher potential, current will flow from the first to the second S/D terminal.

In one embodiment, a write wordline (WL_w) is coupled to the gate terminal of the write selector 241a and a read wordline WL_r is coupled to the gate terminal of the read selector 241b. During a write operation, the WL_w is activated, causing the write selector to couple the storage unit to the SL, creating the write path through the first select transistor. During a read operation, the WL_r is activated while WL_w is inactive. This forms a read path through the second select transistor to the SL.

In one embodiment, the WL_r can be activated during a write operation as well. For example, WL_r may optionally serve as a WL_w during a write operation. For example, WL_r can be activated during both read and write operations while WL_w is only activated during a write operation.

Depending on whether the write is a "1" or a "0", the write current is from the BL to the SL or from SL to the BL. If the write current is in the direction of the TFET of the read selector, write current $I_{write}$ is provided by both transistors. For example, the write path between BL and SL are through both select transistors. This enhances the write speed. On the other hand, if the write current is in the opposite direction as the TFET of the read selector, the write path is between SL and BL through the write select transistor.

As for the read path, it is formed only through the read select transistor, which is a TFET. The use of a TFET in the read selector results in a tighter read current $I_{read}$. This reduces variation, improving read margin. This results in faster read speed. Furthermore, TFET can operate at lower voltages, reducing power consumption. The benefits of the TFET also extends to write operations when it is used, such as when write current is in the same direction.

To summarize, the cell selector has an asymmetrical design having different types of transistors. In particular, the read select transistor is a TFET while the write select transistor is a MOSFET. The asymmetrical design of the selector, as discussed, enables higher read/write speed and stability with lower power consumption.

As shown in FIG. 2a, the read select transistor is a n-type TFET (nTFET). The nTFET is configured to have current flow in a direction from the BL to the SL. For example, the drain terminal is a n-type drain terminal while the source terminal is a p-type source terminal. As for the write select transistor, it is a n-type MOS (nMOS) transistor. For example, the drain and source terminals are n-type drain and source terminals. The write select transistor has current flowing in both directions between the drain and source terminals.

Table 1 below shows exemplary signals or bias conditions applied to the memory cell of FIG. 2a for read and write operations.

TABLE 1

| operation | Signal | | | |
|---|---|---|---|---|
| | SL | BL | WL_r | WL_w |
| Read | LOW | VBL, read | VWL, read | LOW |
| Write "0" | VSL, write | LOW | LOW | VWL, write |
| Write "1" | LOW | VBL, write | LOW or VWL, write | VWL, write or Low |

The voltage values for a logic "LOW" may be 0 V, logic "VBL, write" may be about 0.5-1.5 V, "VBL, read" may be about 0.05-0.2 V, "VWL, read" may be about 0.5-1.5 V and "VWL, write" may be about 1 to 2 V. The voltage values are exemplary and may change depending on, for example, the technology node. The table presumes the current direction for setting the free layer to be anti-parallel with the fixed layer is from the SL to the BL and setting the free layer to be parallel with the fixed layer is from BL to SL. As such, writing a "1" is in the same current direction as the read. For a write "1" operation, the second or read select transistor may optionally be activated to generate a write current to augment the write current from the first select transistor. Please note that, in the case where the write current direction is in the same direction as the TFET, such as write "1", the write may be effected by both TFET and nFET, TFET only or nFET only. Although not indicated, the WL_r may be activated during a write operation in the opposite direction. However, the TFET will have no effect since the current is in the opposite direction.

Figure 2B:
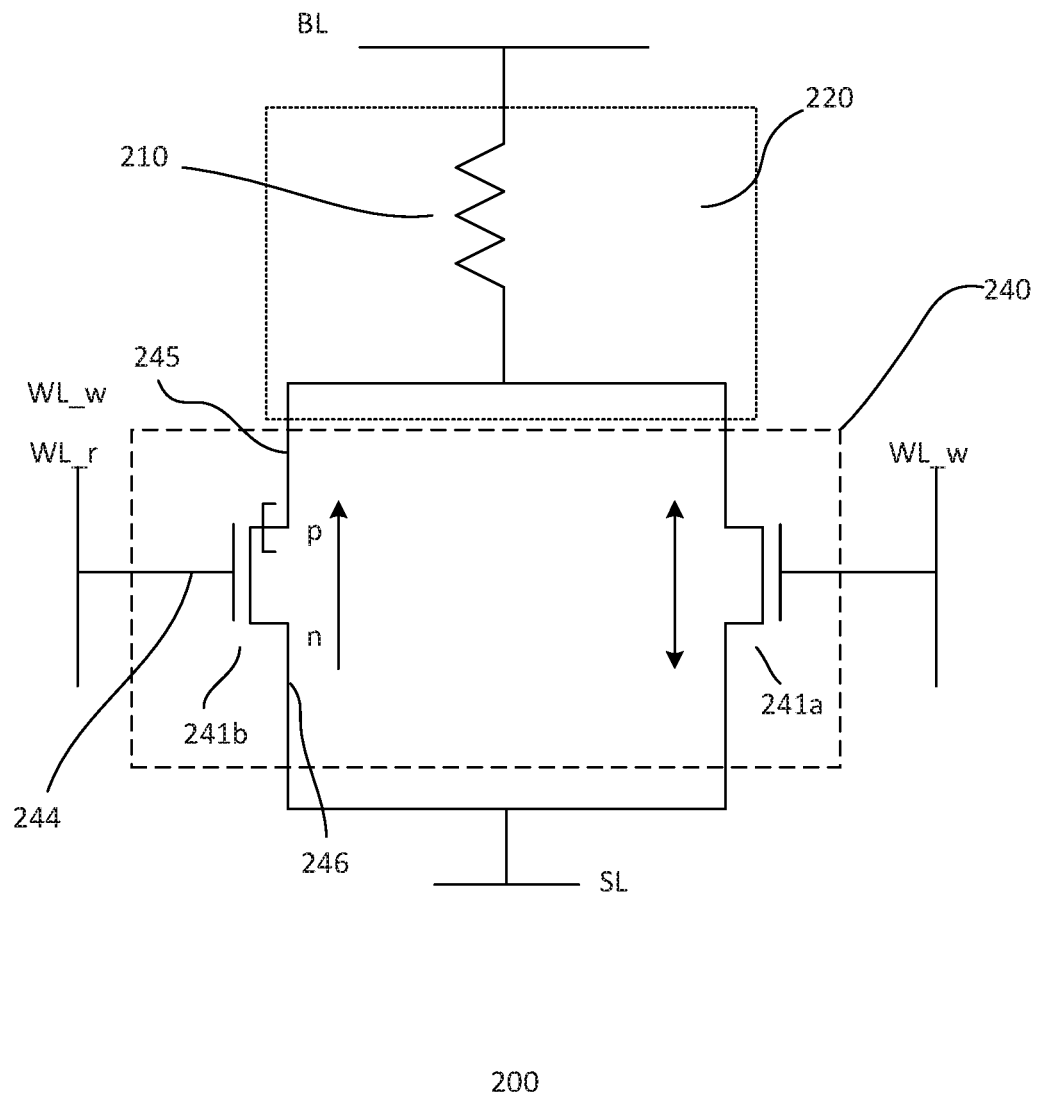

As shown in FIG. 2b, the read select transistor is a nTFET. The nTFET is configured to have current flow in a direction from the SL to the BL. For example, the drain terminal is a p-type drain terminal while the source terminal is a n-type source terminal. As for the write select transistor, it is a nMOS transistor. For example, the drain and source terminals are n-type drain and source terminals. The write select transistor has current flowing in both directions between the drain and source terminals.

Table 2 below shows exemplary signals or bias conditions applied to the memory cell of FIG. 2b for read and write operations.

TABLE 2

| operation | Signal | | | |
|---|---|---|---|---|
| | SL | BL | WL_r | WL_w |
| Read (alt) | VSL, read | LOW | VWL, read | LOW |
| Write "0" | VSL, write | LOW | LOW or VWL, write | VWL, write or Low |
| Write "1" | LOW | VBL, write | LOW | VWL, write |

The voltage values for a logic "LOW" may be 0 V, logic "VBL, write" may be about 0.5-1.5 V, "VBL, read" may be about 0.05-0.2 V, "VWL, read" may be about 0.5-1.5 V and "VWL, write" may be about 1 to 2 V. The voltage values are exemplary and may change depending on, for example, the technology node. The table presumes that the current direction for setting the free layer to be anti-parallel with the fixed layer is from the SL to the BL and setting the free layer to be parallel with the fixed layer is from BL to SL. As such, writing a "0" is in the same current direction as the read, which is from SL to BL. The read from SL to BL may be referred to as an alternate read (read (alt)) operation. For a write "0" operation, the second or read select transistor may optionally be activated to generate a write current to augment the write current from the first select transistor. Please note that, in the case where the write current direction is in the same direction as the TFET, such as write "0", the write may be effected by both TFET and nFET, TFET only or nFET only. Although not indicated, the WL_r may be activated during a write in the opposite direction. However, the TFET will have no effect since the current is in the opposite direction.

Figure 2C:
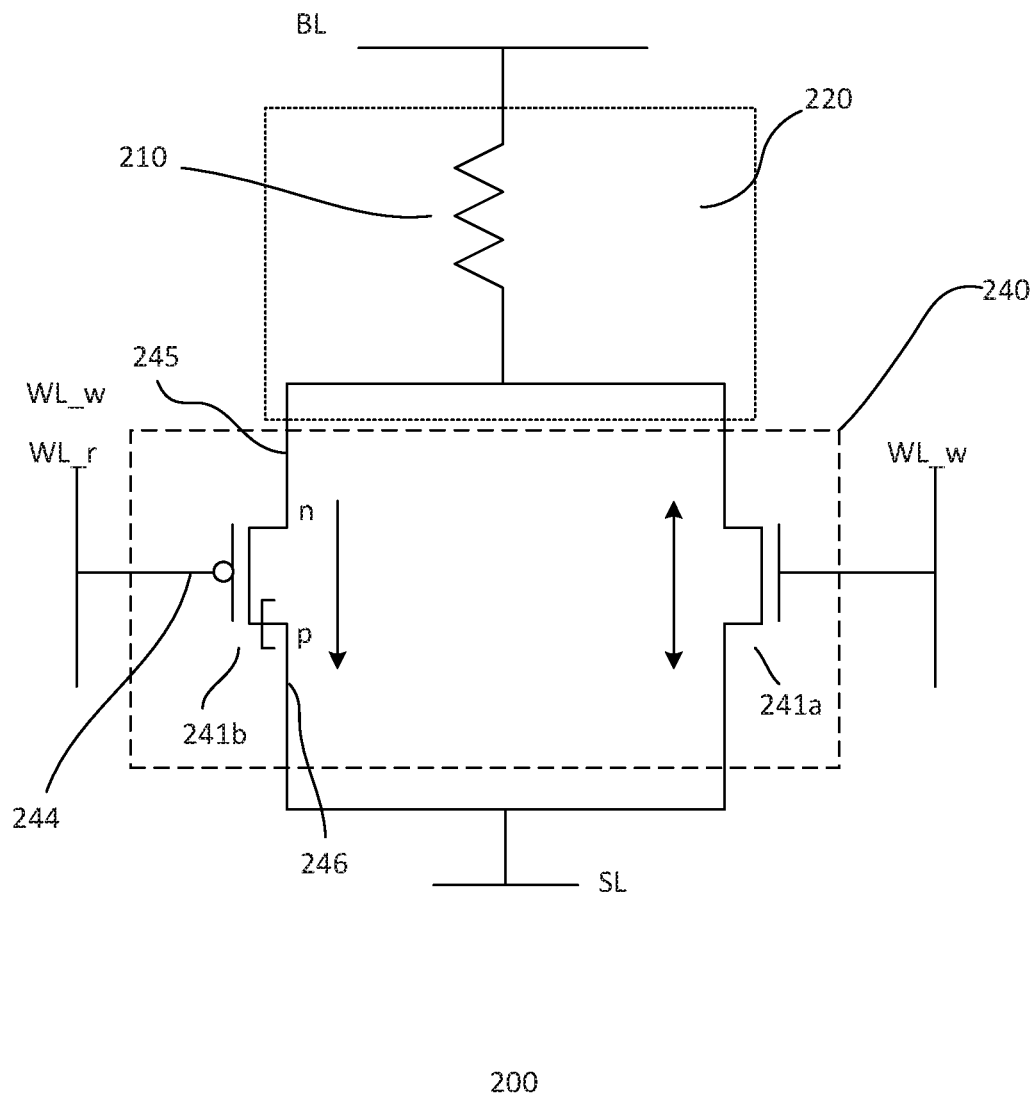

As shown in FIG. 2c, the read select transistor is a p-type TFET (pTFET). The pTFET is configured to have current flow in a direction from the BL to the SL. For example, the drain terminal is a n-type drain terminal while the source terminal is a p-type source terminal. As for the write select transistor, it is a nMOS transistor. For example, the drain and source terminals are n-type drain and source terminals. The write select transistor has current flowing in both directions between the drain and source terminals. The bias conditions for the different operations of the memory cell may be similar to that provided in Table 1.

Figure 2D:
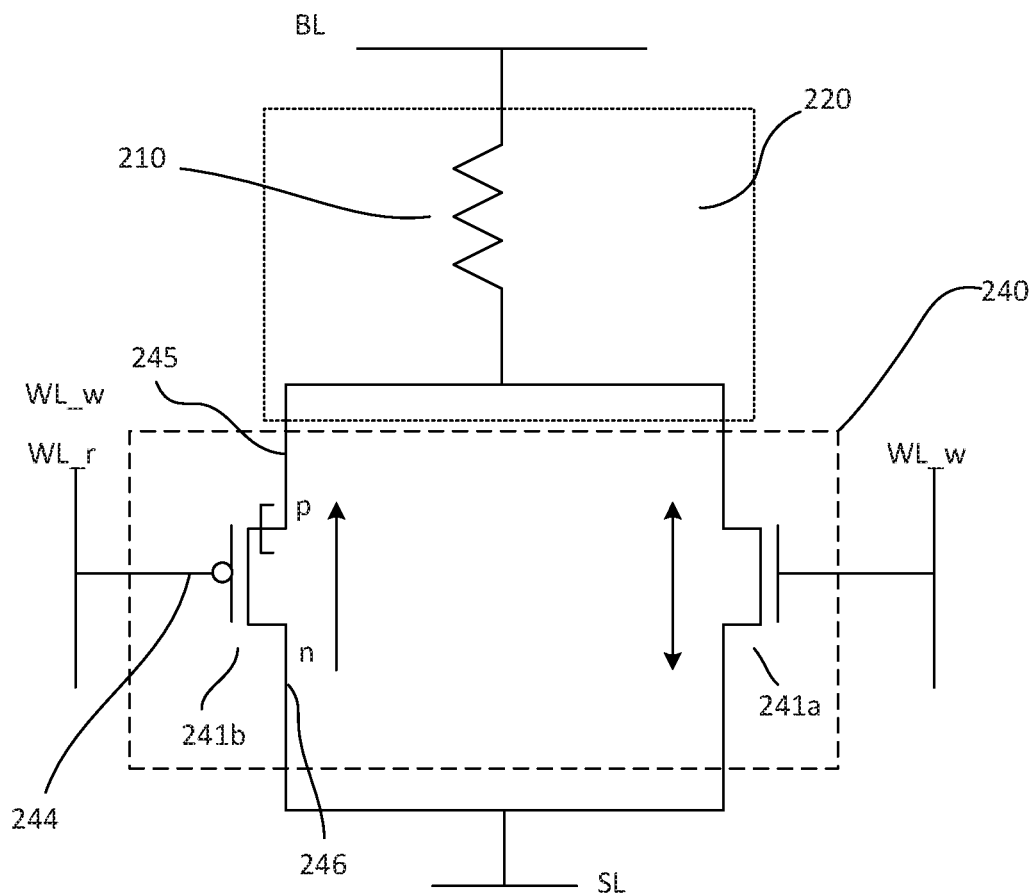

As shown in FIG. 2d, the read select transistor is a pTFET. The pTFET is configured to have current flow in a direction from the SL to the BL. For example, the drain terminal is a p-type drain terminal while the source terminal is a n-type source terminal. As for the write select transistor, it is a nMOS transistor. For example, the drain and source terminals are n-type drain and source terminals. The write select transistor has current flowing in both directions between the drain and source terminal. The bias conditions for the different operations of the memory cell may be similar to that provided in Table 2.

Although the various memory cells of FIGS. 2a-2d are described with a first select transistor which is a nMOS transistor, it is understood that the first select transistor may be a pMOS transistor. The bias conditions would be similar except that activating the pMOS transistor is effected by a logic low or 0 V signal.

FIGS. 3a-3d show schematic diagrams of different embodiments of a memory cell 300. The memory cell is a non-volatile memory cell. For example, the memory cell may be a magnetic memory cell. In one embodiment, the memory cell is a Spin Transfer Torque-Magnetic Random Access Memory (STT-MRAM) cell. Other suitable types of memory cells may also be useful. The memory cells are similar to those described in FIGS. 2a-2d. Common elements may not be described or described in detail.

The memory cell includes a storage unit 220 and a cell selector unit 240. The storage unit is coupled to the cell selector unit. The storage unit 220, in one embodiment, includes a storage element 210. The storage element, for example, may be a resistive storage element, such as a MTJ storage element. The MTJ element may include MTJ elements such as those described in FIGS. 1a-1b. Other suitable types of MTJ or resistive storage elements may also be useful. The top of the MTJ stack is coupled to a bitline BL while the bottom of the MTJ stack is coupled to the selector unit.

As for the cell selector unit 240, it includes first and second selectors or selector subunits 241a-241b. A selector subunit includes a select transistor. For example, the first selector subunit includes a first select transistor and the second selector subunit includes a second select transistor. In one embodiment, the select transistors of the first and second selectors are TFETs. As previously described, a drain terminal of the select transistor is coupled to the storage unit while the source terminal is coupled to the SL. For example, the drain terminals 245 of the transistors are coupled to the storage unit and the source terminals 246 of the transistors are commonly coupled to a source line SL of the memory cell. The gates of the TFETs, as shown, are coupled to a common control signal WL_r/w. For example, the gates of the TFETs may be a common gate or coupled to a common control signal WL_r/w. Providing the gates of the TFETs with separate control signals may also be useful.

The first and second TFETs are configured to have opposite current directions. For example, one of the TFETs has current flowing from drain to source while the other has current flowing from source to drain. Due to the unidirectional current flow of the TFETs, they can be both "ON" at the same time. For example, one TFET will be used to perform a write in a first direction while the other TFET will be used to perform a write in the opposite direction. For example, one TFET will be used to perform a write "1" while the other is used to perform a write "0". Either of the TFETs may be used for a read operation, depending on the direction of the read. For example, one may be used for a read (from BL to SL) while the other would be used for an alternate read (from SL to BL).

By using a TFET to perform read and write operations, tighter $I_{read}$ and $I_{write}$ can be achieved. Tighter $I_{read}$ and $I_{write}$ reduce variations, improving read and write margins. This results in faster read and write speed. Furthermore, TFET can operate at lower voltages, reducing power consumption.

Figure 3A:
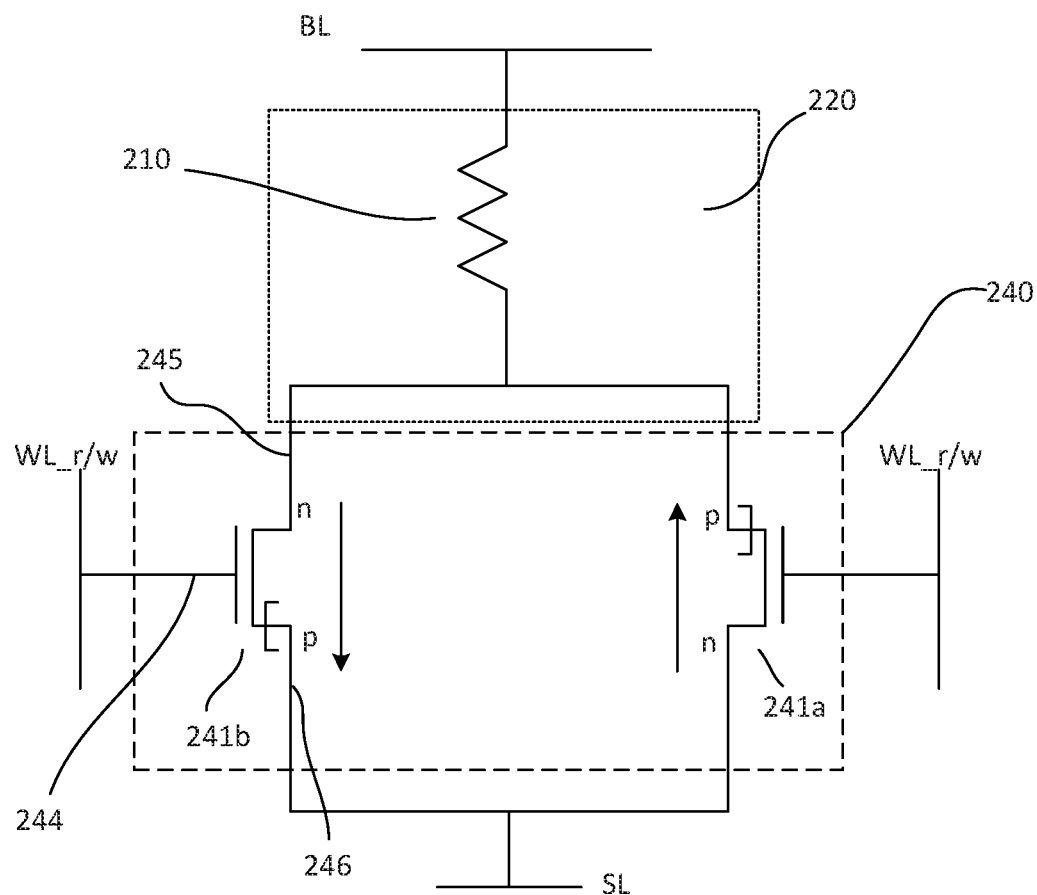
FIGS. 3a-3d illustrate various other embodiments of a memory cell.

As shown in FIG. 3a, the first and second select transistors are nTFETs. The first nTFET of the first selector unit is configured to have current flow in a direction from the SL to the BL while the second nTFET of the second selector unit is configured to have current flow in an opposite direction, i.e. from BL to SL. For example, the first nTFET includes a n-type terminal connected to SL and a p-type terminal connected to BL. As for the second nTFET, the n-type and p-type terminals are swapped.

Table 3 below shows exemplary signals or bias conditions applied to the memory cell of FIG. 3a for read and write operations.

TABLE 3

| operation | Signal | | |
|---|---|---|---|
| | SL | BL | WL_r/w |
| Read | LOW | VBL, read | VWL, read |
| Read (alt) | VSL, read | LOW | VWL, read |
| Write "0" | VSL, write | LOW | VWL, write |
| Write "1" | LOW | VBL, write | VWL, write |

The voltage values for a logic "LOW" may be 0 V, logic "VBL, write" may be about 0.5-1.5 V, "VBL, read" may be about 0.05-0.2 V, "VWL, read" and "VWL, write" may be about 0.5-2 V. The voltage values are exemplary and may change depending on, for example, the technology node. The table presumes that current direction for setting the free layer to be anti-parallel with the fixed layer is from the SL to the BL and setting the free layer to be parallel with the fixed layer is from BL to SL. A user may select a read in the BL to SL direction or an alternate read from the SL to BL direction.

Figure 3B:
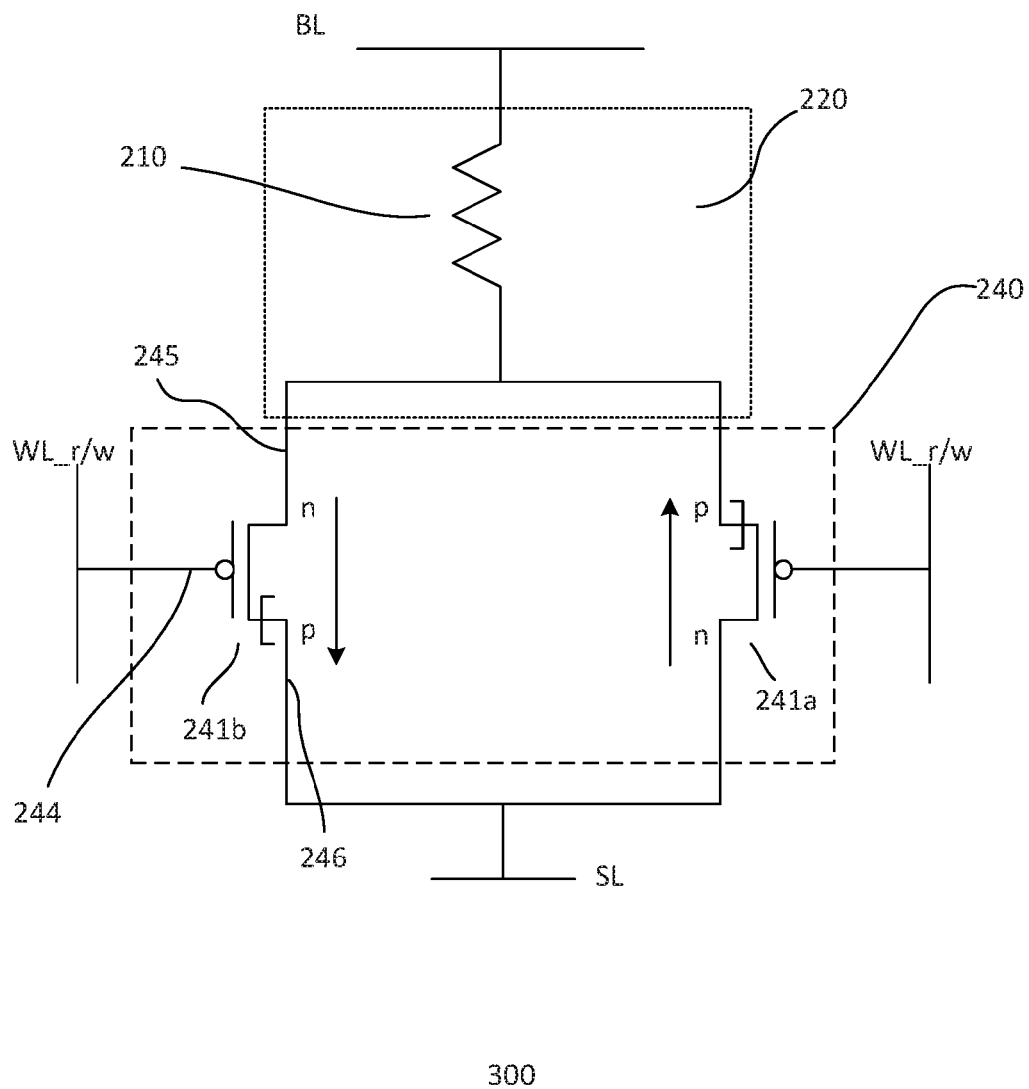

As shown in FIG. 3b, the first and second select transistors are pTFETs. The first pTFET is configured to have current flow in a direction from the SL to the BL while the second pTFET is configured to have current flow in an opposite direction, i.e. from BL to SL. For example, the first pTFET includes a p-type terminal connected to BL and a n-type terminal connected to SL. As for the second pTFET, the terminals are swapped. The bias conditions for the different operations of the memory cell may be similar to that provided in Table 3, except that VWL_r/w is a logic "LOW".

Figure 3C:
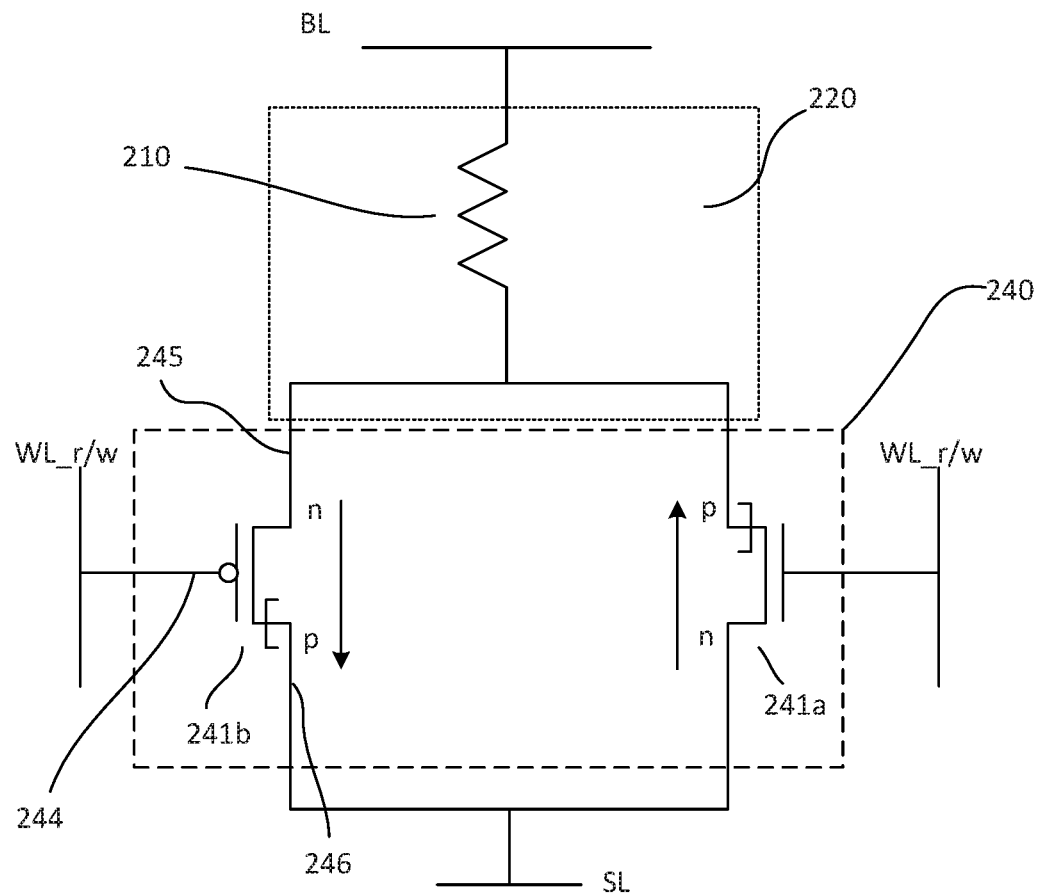

As shown in FIG. 3c, the first select transistor is a nTFET and the second select transistor is a pTFET. The first nTFET is configured to have current flow in a direction from the SL to the BL while the second pTFET is configured to have current flow in an opposite direction i.e. from BL to SL. For example, the first nTFET includes a p-type terminal connected to BL and a n-type terminal connected to SL. As for the second pTFET, BL is connected to a n-type terminal while the SL is connected to a p-type terminal. The bias conditions for the different operations of the memory cell may be similar to that provided in Table 3, except that when the pTFET is to be turned ON, VWL_r/w is a logic "LOW" and when the nTFET is to be turned ON, VWL_r/w is about 1-2 V.

Figure 3D:
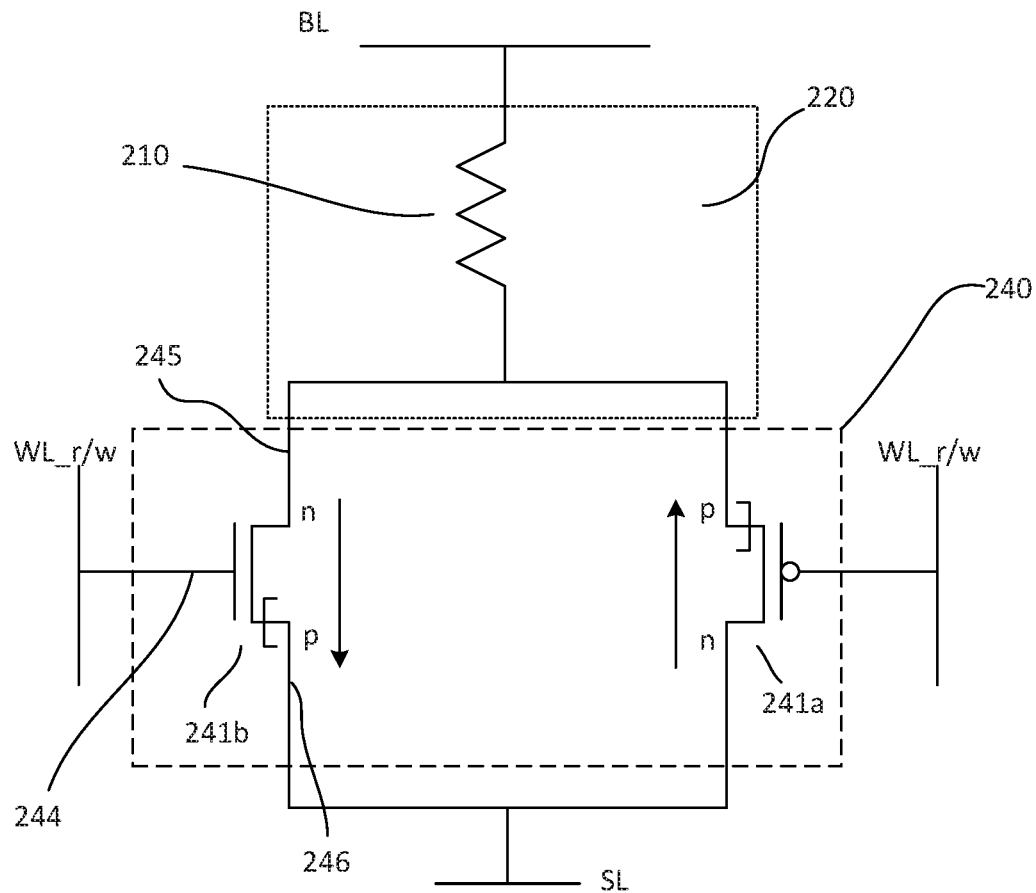

As shown in FIG. 3d, the first select transistor is a pTFET and the second select transistor is a nTFET. The first pTFET is configured to have current flow in a direction from the SL to the BL while the second nTFET is configured to have current flow in an opposite direction i.e. from BL to SL. For example, the first pTFET includes a p-type terminal connected to BL and a n-type terminal connected to SL. As for the second nTFET, the SL terminal is connected a p-type terminal while the BL terminal is connected to a n-type terminal. The bias conditions for the different operations of the memory cell may be similar to that provided in Table 3, except that when the pTFET is to be turned ON, VWL_r/w is a logic "LOW" and when the nTFET is to be turned ON, VWL_r/w is about 1-2 V.

Figure 4:
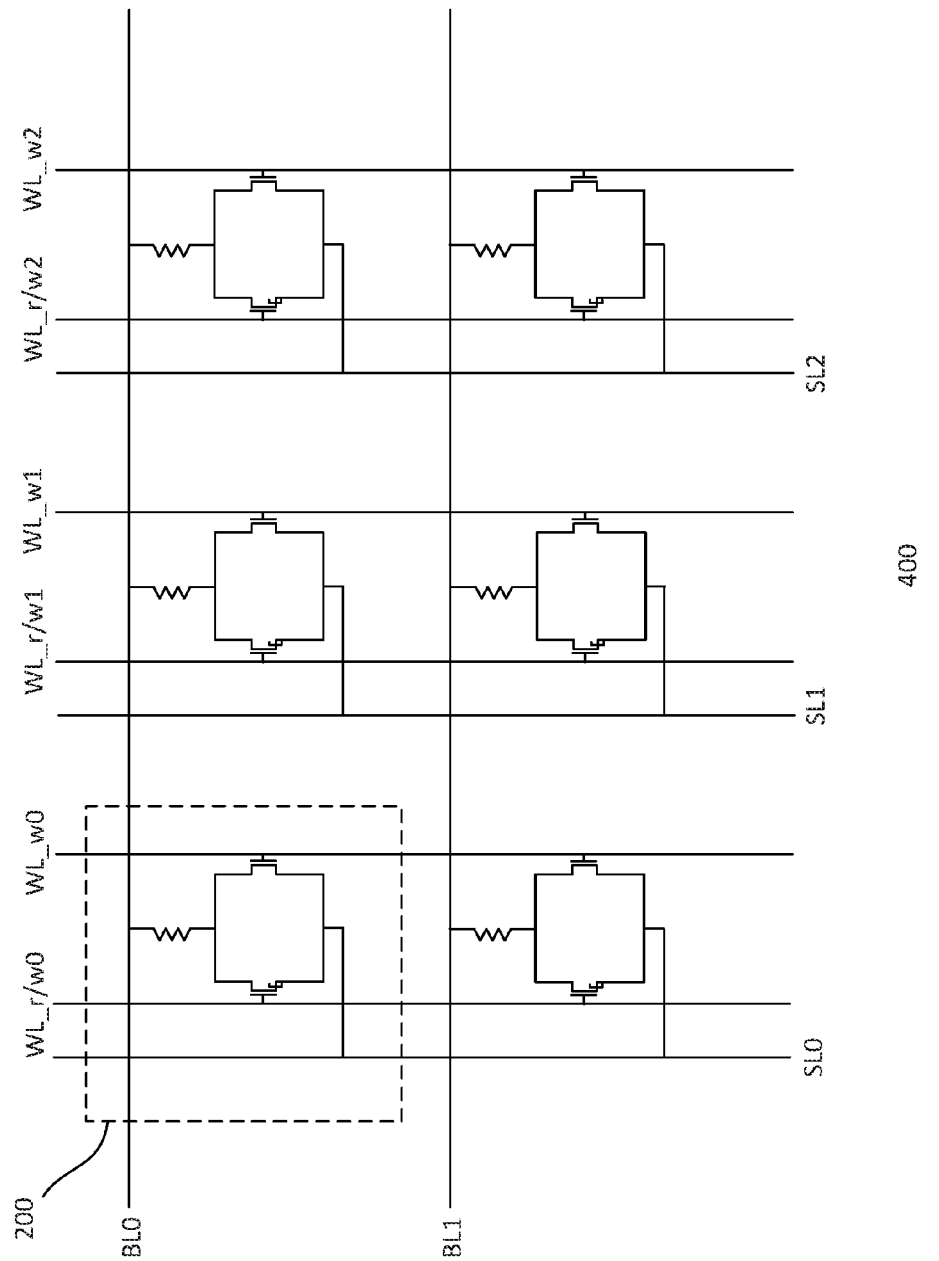
FIG. 4 shows an embodiment of a memory array.

FIG. 4 shows a schematic diagram of an embodiment of a memory array 400. The array includes a plurality of interconnected memory cells 200. The memory cells may be similar to the memory cell described in FIG. 2a. For example, the memory cells are MRAM cells, such as STT-MRAM cells. Other types of memory cells may also be useful. Common elements may not be described or described in detail. In one embodiment, a memory cell includes a first select transistor which is a nMOS transistor and a second select transistor which is a nTFET. Other types of memory cells may also be useful. For example, a memory array may be configured with a memory cell, such as that described in FIG. 2b, FIG. 2c or FIG. 2d.

As shown, the array includes six memory cells arranged in a 3×2 array. For example, the array is arranged to form three rows and two columns of memory cells. Memory cells of a row are interconnected by WL_r/w, WL_w, and SL lines (WL_r/w0, WL_w and SL0; WL_r/w1. WL_w1 and SL1; or WL_r/w2, WL_w2, SL2) while memory cells of a column are interconnected by a BL line (BL0; or BL1).

Figure 5:
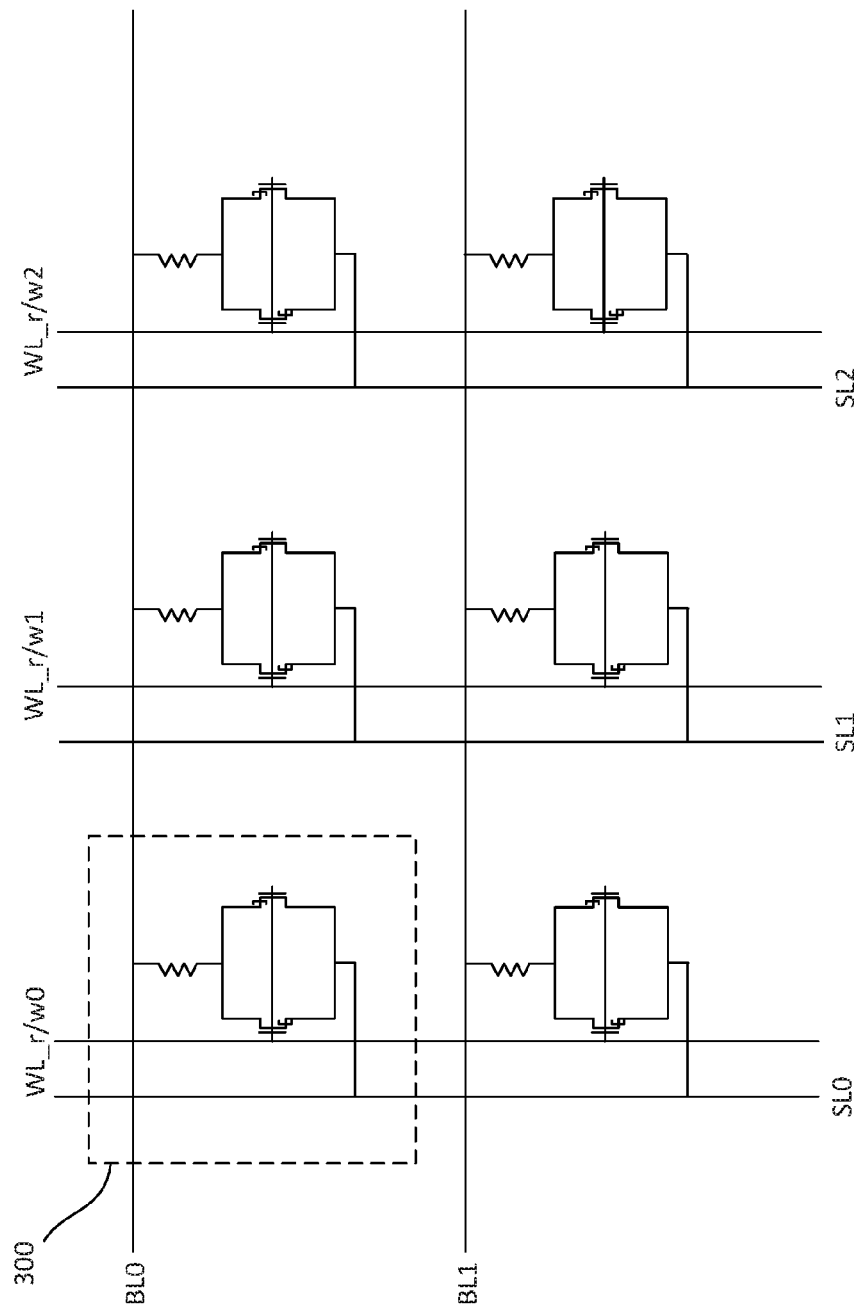
FIG. 5 shows another embodiment of a memory array.

FIG. 5 shows a schematic diagram of an embodiment of a memory array 500. The array includes a plurality of interconnected memory cells 300. The memory cells may be similar to the memory cell described in FIG. 3a. For example, the memory cells are MRAM cells, such as STT-MRAM cells. Other types of memory cells may also be useful. Common elements may not be described or described in detail. In one embodiment, a memory cell includes select transistors which are nTFETs. Other types of memory cells may also be useful. For example, a memory array may be configured with a memory cell, such as that described in FIG. 3b, FIG. 3c or FIG. 3d.

As shown, the array includes six memory cells arranged in a 3×2 array. For example, the array is arranged to form three rows and two columns of memory cells. Memory cells of a row are interconnected by WL_r/w and SL lines (WL_rw0 and SL0; WL_r/w1 and SL1; or WL_r/w2, SL2) while memory cells of a column are interconnected by a BL line (BL0; or BL1).

Figure 6A:
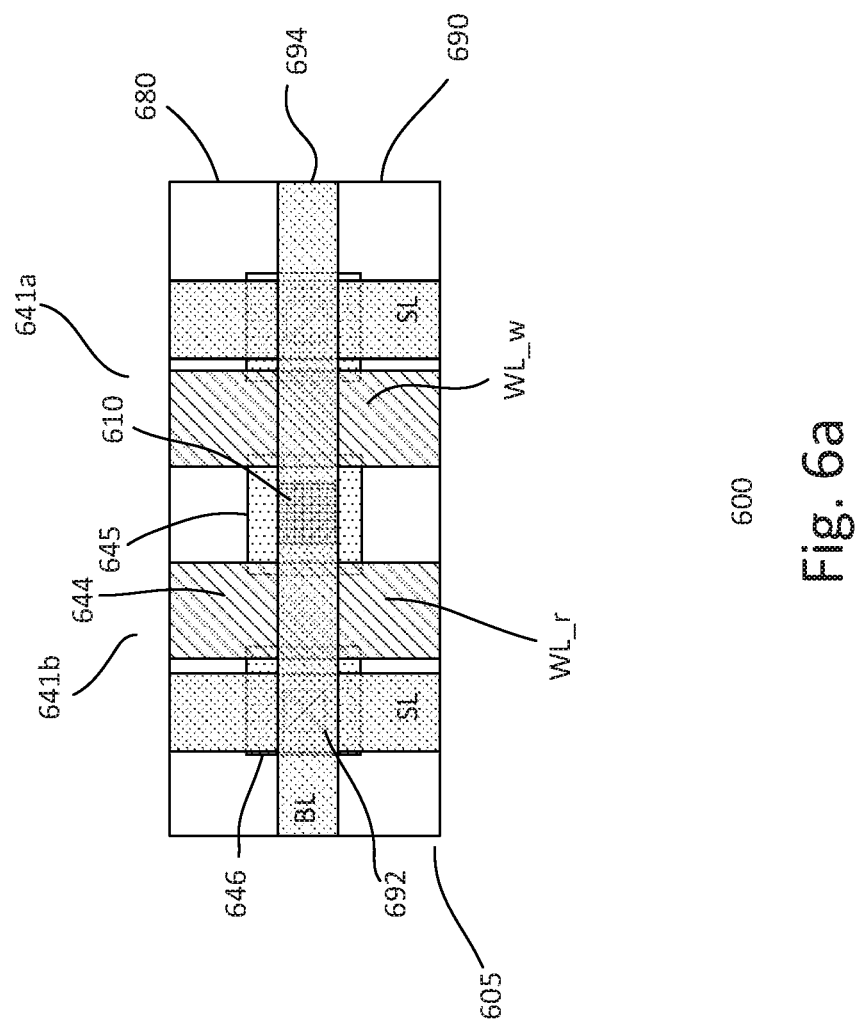
FIGS. 6a-6b show top and cross-sectional views of an embodiment of a memory cell.
Figure 6B:
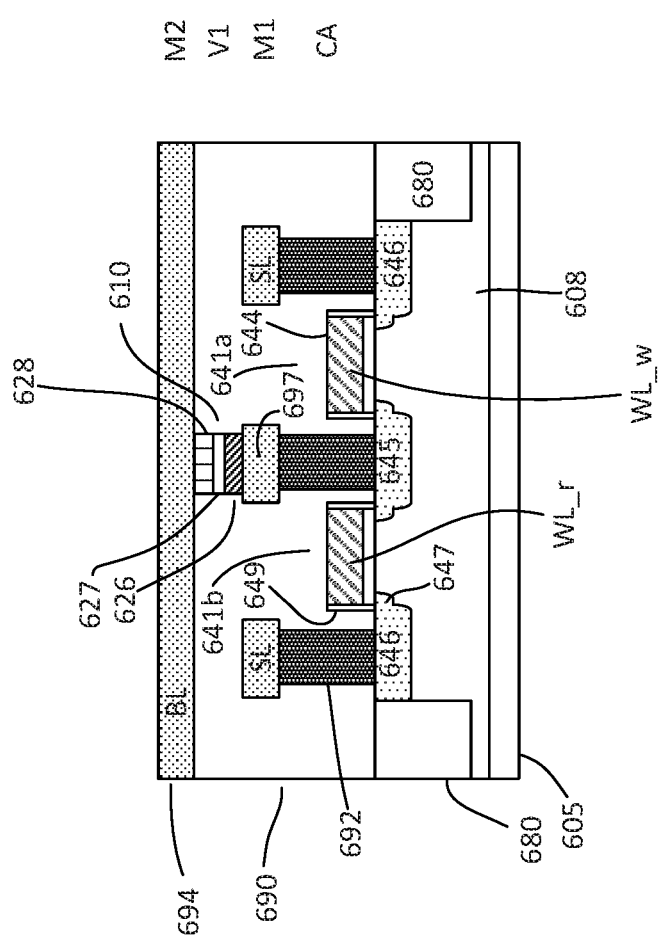

FIGS. 6a-6b show top and cross-sectional views of an embodiment of a device 600. The device, as shown, includes a memory cell. The memory cell, for example, may be a NVM cell. The memory cell, in one embodiment, is a magnetoresistive NVM cell, such as a STT-MRAM cell. The memory cell, for example, is similar to that described in FIG. 2a. Common elements may not be described or described in detail.

The memory cell is disposed on a substrate 605. For example, the memory cell is disposed in a cell region of the substrate. The cell region may be part of an array region. For example, the array region may include a plurality of cell regions. The substrate may include other types of device regions (not shown), such as high voltage (HV) as well as logic regions, including low voltage (LV) and intermediate voltage (IV) device regions. Other types of regions may also be provided.

The substrate, for example, is a semiconductor substrate, such as a silicon substrate. For example, the substrate may be a lightly doped p-type substrate. Providing intrinsic or other types of doped substrates, such as silicon germanium (SiGe), germanium (Ge), gallium arsenide (GaAs) or any other suitable semiconductor materials, may also be useful. In some embodiments, the substrate may be a crystalline-on-insulator (COI) substrate. A COI substrate includes a surface crystalline layer separated from a bulk crystalline by an insulator layer. The insulator layer, for example, may be formed of a dielectric insulating material. The insulator layer, for example, includes silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

Isolation regions 680 may be provided. In one embodiment, the isolation regions are shallow trench isolation (STI) regions. Other types of isolation regions may also be useful. The isolation regions are provided to isolate device regions from other regions. In one embodiment, isolation regions may be provided to isolate memory cells from each other. For example, a memory cell may be formed in a cell region which is isolated from other cell regions by isolation regions. Other suitable configurations of isolation regions may also be useful.

A cell selector unit is provided in the cell region. The cell selector unit includes first and second selectors 641*a*-641*b*. The first selector 641*a*, for example, may be a write selector and the second selector 641*b* is a read selector. The selectors, in one embodiment, include transistors. In one embodiment, the first select transistor is a MOS transistor and the second select transistor is tunneling transistor, such as a TFET. In one embodiment, the first select transistor is a nMOS transistor and the second select transistor is a nTFET.

The cell region includes a device well or body well 608 which serves as a body of the transistors. For example, the cell region includes a body or device well for transistors of the selectors. The device well may be a continuous well for the entire memory array. The body well may be doped with second polarity type dopants for a first polarity type first select transistor. The body well, in one embodiment, is a p-type doped well for nMOS transistor of the first select unit. The device well may be lightly or intermediately doped with second polarity type dopants. For example, the device well may have a dopant concentration of about 1E16 to 1E19/cm$^3$. Other suitable dopant concentrations may also be useful.

A transistor, as shown, includes first and second source/drain (S/D) regions 645 and 646. A gate 644 is disposed on the substrate between the S/D regions. A gate, for example, may include a gate electrode over a gate dielectric. The gate electrode may be polysilicon while the gate dielectric may be silicon oxide. Other suitable types of gate electrode and gate dielectric materials may also be useful. For example, a gate may be a metal gate with a metal gate electrode and a high k gate dielectric. A gate, for example, may be a gate conductor along a first or word line (WL) direction. The gate conductor forms a common gate for a row of memory cells.

As for the S/D regions, they are heavily doped regions. A S/D region may include a lightly doped (LD) extension region 647. The LD extension region is doped with the same polarity type dopant as the S/D region. An LD extension region, for example, is a lightly doped region and extends slightly under the gate. The gate may include dielectric sidewall spacers 649. The spacers, for example, facilitate in forming the LD extension regions 647 and heavily doped S/D regions. The spacers may be silicon oxide spacers. In some embodiments, the spacers are composite spacers having multiple layers, such as silicon oxide under silicon nitride. Other spacer configurations may also be useful.

In some embodiments, a halo region may also be provided for a S/D region. The halo region, for example, extends beyond the LD region. Furthermore, the common S/D region of the select transistors may have a split halo region to form split halo regions, one tailored for the MOS transistor and the other for the TFET. In yet some embodiments, the source of the TFET does not include an LD region. Other configurations of the transistors may also be useful.

The various contact regions, such as the S/D regions and the gates may be provided with metal silicide contacts (not shown). The metal silicide contacts, for example, may be a Ni-based metal silicide contacts. Other types of metal silicide contacts may also be useful. The metal silicide contacts reduce contact resistance, improving performance.

As discussed, the first select transistor is a nMOS transistor. The nMOS transistor includes n-type heavily doped S/D regions 645 and 646. As for the second select transistor, it is a nTFET configured with a n-type drain terminal and p-type source terminal. The well serves as an intrinsic region between the different polarity type doped regions. Since both transistors have the same polarity type (n-type) drain terminals, they can share a common drain. The gate of the first select transistor serves as WL_w and the gate of the second select transistor serves as WL_r.

Disposed over the transistors is a dielectric layer 690. The dielectric layer serves as a backend dielectric layer. The backend dielectric layer may include one or more interlevel dielectric (ILD) layers. An ILD layer includes a metal level and a contact level. The metal level includes conductors or metal lines while the contact level includes contacts. The conductors and contacts may be formed of a metal, such as copper, copper alloy, aluminum, tungsten or a combination thereof. Other suitable types of metals, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE), may also be employed to form metal lines.

As discussed, the backend dielectric layer may include a plurality of ILD levels. For example, x number of ILD levels may be provided. A metal level of an ILD level may be referred to as $M_i$, where i is the $i^{th}$ ILD level of x ILD levels. A contact level of an ILD level may be referred to as $V_{i-1}$, where i is the $i^{th}$ ILD level of x ILD levels. As shown, the dielectric layer includes ILD levels up to M2. The dielectric layer may include additional ILD levels (not shown). The number of levels may depend on design requirements. For example, the dielectric layer may include 6 ILD levels. For example, the dielectric layer may include up to M6. Other suitable number of ILD levels may also be useful.

For the first contact level, it may be referred to as a CA or a pre-metal dielectric (PMD) level. The first metal level may be referred to as M1. For the first ILD level, contacts and metal lines may be formed by separate single damascene processes. Contacts in the PMD level may be tungsten contacts while conductors or metal lines in M1 may be formed of copper or copper alloy. For upper ILD levels, metal lines and contacts may be formed by dual damascene techniques. Dual damascene processes may employ copper or copper alloys for contacts and conductive lines. Other configurations or techniques for forming lines and contacts of the ILD levels may also be useful.

A dielectric liner may be disposed between ILD levels. The dielectric liner, for example, serves as an etch stop layer. The dielectric liner may be formed of a low k dielectric. For example, the dielectric liner may be nBLOK. Other types of dielectric materials for the dielectric liner may also be useful.

As shown, contacts 692 are disposed in the CA level of the backend dielectric layer. The contacts, for example, are in communication with the drain and source regions 645 and 646 of the select transistors. Conductive lines 694 are disposed in the first metal or M1 level above the CA level.

In one embodiment, SLs are coupled to the source regions of the select transistors. For example, a first SL is coupled to the source region of the first select transistor and a second SL is coupled to the source region of the second select transistor. The SLs are connected to the source regions via contacts in the CA level. The SLs are disposed in the wordline direction. For example, the SLs are parallel with the gates. The SLs may be connected to each other. For example, the SLs are a common SL interconnected together. In addition, an interconnect pad 697 is disposed in M1. The interconnect pad is coupled to the contact disposed over the common drain 645 in the CA level. The pad serves as a storage interconnect pad.

A storage element 610 may be disposed in the storage dielectric layer above the interconnects connecting to the various transistors of the select unit. For example, the storage element may be disposed in a storage dielectric layer over the first metal level. The storage dielectric layer may be a via level V1, as shown above M1. Providing the storage dielectric layer in other upper levels may also be useful. The storage element may be provided in a storage dielectric level.

The storage element, in one embodiment, is a MTJ element, as described in FIGS. 1*a*-1*b*. Other types of storage or resistive storage elements may also be useful. For example, the MTJ element includes a tunneling barrier layer 627 disposed between fixed and free layers 626 and 628. As shown, the MTJ element is a bottom pinned MTJ element. In one embodiment, the MTJ element is a bottom pinned perpendicular MTJ element. The MTJ element may include top and bottom electrodes (not shown), such as Ta or TaN electrodes. Other types or configurations of the storage elements may also be useful. For example, the MTJ element may be a top pinned or have a horizontal magnetization direction.

Above the storage dielectric layer is a metal level of an ILD level. For example, the metal level is M2. Other metal level may also be useful. The metal level includes metal lines disposed in a dielectric layer. The metal line and top of the dielectric layer have coplanar top surfaces. In one embodiment, a bit line (BL) is coupled to the storage element.

Although as described, the various lines and storage element are disposed in specified dielectric levels of the backend dielectric levels, other configurations may also be useful. For example, they may be disposed in other upper or additional metal levels. For example, the storage element may be provided in an upper via level, such as between M5 and M6. In such cases, the BL may be disposed in M6. In some embodiments, metal wordlines can be provided in a metal level and coupled to the gates. The metal wordlines may be provided in M1 or other metal levels in which metal lines are parallel with them. Furthermore, the device may include other device regions and components.

As described, the drain regions of the first and second select transistors are the same. In the case where the drain regions are of opposite polarity type, they may be separate drain regions separated by an STI region. For example, the drain of the nTFET may be p-type while the drain of the nMOS transistor is n-type. Other configuration of transistors, such as those described in FIGS. 2*b*-2*d* may also be useful. Also, providing a pMOS transistor as the first select transistor may also be useful.

Figure 7A:
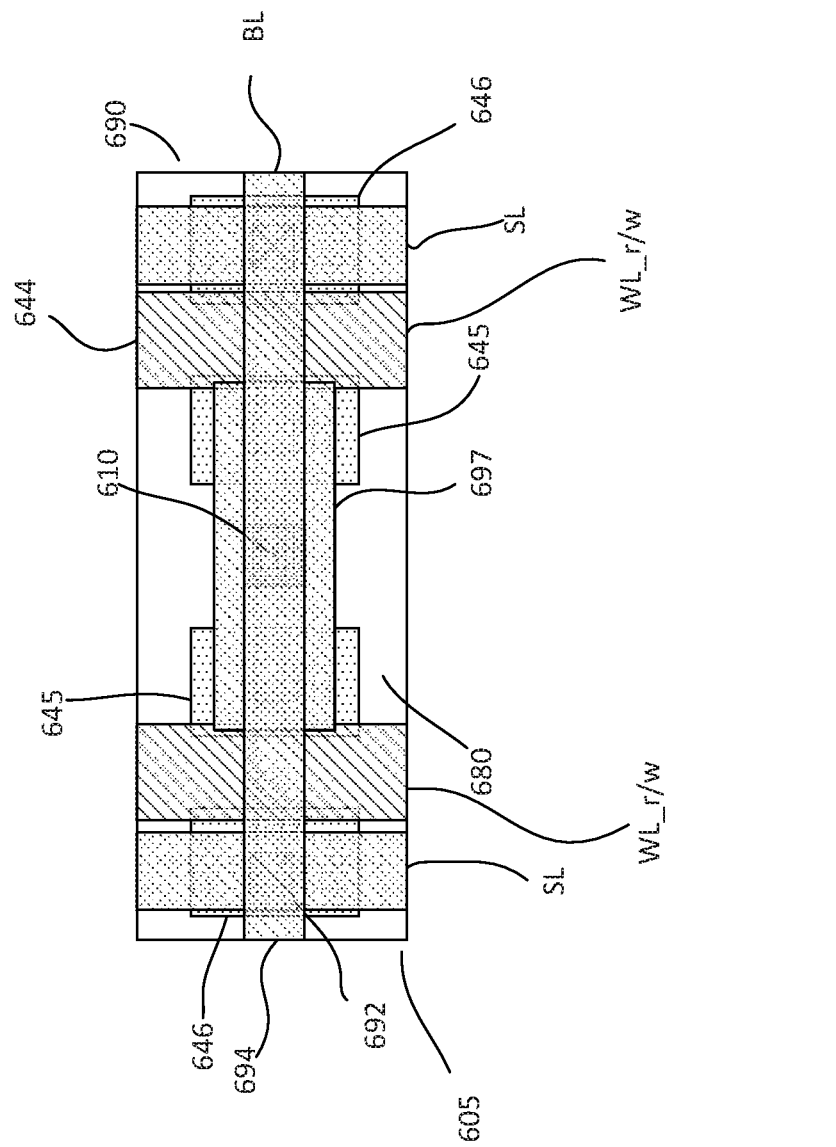
FIGS. 7a-7b show top and cross-sectional views of another embodiment of a memory cell.
Figure 7B:
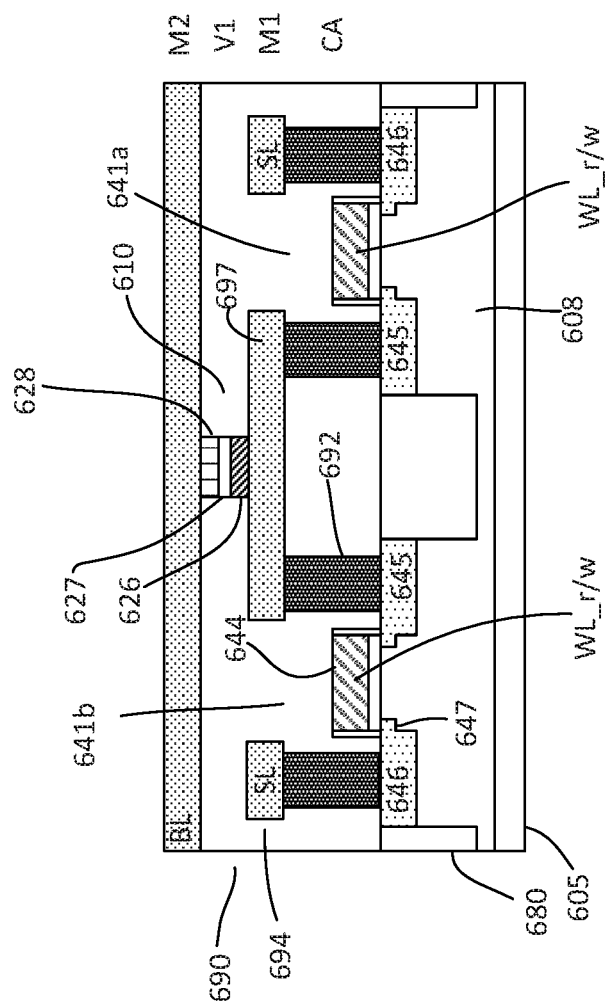

FIGS. 7*a*-7*b* show top and cross-sectional views of another embodiment of a device 700. The device, as shown, includes a memory cell. The memory cell, for example, may be a NVM memory cell. The memory cell, in one embodiment, is a magnetoresistive NVM cell, such as a STT-MRAM cell. The memory cell, for example, is similar to that described in FIGS. 3*a* and 6*a*-6*b*. Common elements may not be described or described in detail.

The memory cell is disposed on a substrate 605. For example, the memory cell is disposed in a cell region of the substrate. The cell region may be part of an array region. For example, the array region may include a plurality of cell regions. The substrate may include other types of device regions (not shown), such as high voltage (HV) as well as logic regions, including low voltage (LV) and intermediate voltage (IV) device regions. Other types of regions may also be provided.

The substrate, for example, is a semiconductor substrate, such as a silicon substrate. Other types of doped substrates, including COI substrates, may also be useful. Isolation regions 680, such as STI regions, may be provided. The isolation regions are provided to isolate device regions from other regions. In one embodiment, isolation regions may be provided to isolate memory cells from each other. For example, a memory cell may be formed in a cell region which is isolated from other cell regions by isolation regions. Other suitable configurations of isolation regions may also be useful.

A cell selector unit is provided in the cell region. The cell selector unit includes first and second selectors 641*a*-641*b*. A selector includes a TFET. For example, the first selector includes a first TFET and the second selector includes a second TFET. A TFET includes a gate 644 between first and second S/D regions 645 and 646. The first and second S/D regions are heavily doped with opposite polarity type dopants. A S/D region may include a LD extension region 647.

The cell region may include a device well or body well 608. The device well may be a continuous well for the entire memory array. The device well may be a lightly doped well and serves as an intrinsic region for the TFETs between S/D regions. The device well may be lightly or intermediately doped with first or second polarity type dopants. The device well may have a dopant concentration of about 1E15 to 1E19/cm$^3$. Other suitable dopant concentrations may also be useful.

The first S/D region is coupled to a storage element 610 and the second S/D region is coupled to a SL. The S/D region (e.g., first S/D region) coupled to the storage element may be referred to as a drain region and the S/D region (e.g., second S/D region) coupled to SL may be referred to as the source region.

In one embodiment, the TFETs of the selectors are configured to have current flow in opposite directions. For example, one TFET has current flowing from BL to SL while the other TFET has current flowing from SL to BL. In one embodiment, the drain regions of first and second selectors are configured to have opposite polarity type dopants; the source regions of the first and second selectors are configured to have opposite polarity type dopants. Such a configuration results in opposite current flow in the select transistors. Since the drain regions of the select transistors are coupled to the storage unit, they are configured to be adjacent to each other and separated by an isolation region.

The S/D regions may include LD regions and/or halo regions. In some cases, the S/D regions include only halo regions. Other configurations of S/D regions may also be useful.

The various contact regions, such as the S/D regions and the gates may be provided with metal silicide contacts (not shown). The metal silicide contacts, for example, may be a Ni-based metal silicide contacts. Other types of metal silicide contacts may also be useful. The metal silicide contacts reduce contact resistance, improving performance.

Disposed over the transistors is a dielectric layer 690. The dielectric layer serves as a backend dielectric layer with ILD layers. As shown, contacts 692 are disposed in the CA level of the backend dielectric layer. The contacts, for example, are in communication with the drain and source regions 645 and 646 of the select transistors. Conductive lines 694 are disposed in the first metal or M1 level above the CA level. In one embodiment, SLs are coupled to the source regions of the select transistors. For example, a first SL is coupled to the source region of the first select transistor and a second SL is coupled to the source region of the second select transistor. The SLs are connected to the source regions via contacts in the CA level. The SLs are disposed in the wordline direction. For example, the SLs are parallel with the gates. The SLs may be connected to each other. For example, the SLs are a common SL interconnected together. In addition, an interconnect pad 697 is disposed in M1. The interconnect pad 697 is coupled to the drain contacts of the drain regions 645 in the CA level. The pad serves as a storage interconnect pad.

A storage element 610 may be disposed in the storage dielectric layer above the interconnects connecting to the various transistors of the selector unit. For example, the storage elements may be disposed in a storage dielectric layer over the first metal level. The storage dielectric layer may be a via level V1, as shown above M1. Providing the storage dielectric layer in other upper levels may also be useful. The storage element may be provided in a storage dielectric level.

The storage element, in one embodiment, is a MTJ element, as described in FIGS. 1a-1b. Other types of storage or resistive storage elements may also be useful. For example, the MTJ element includes a tunneling barrier layer 627 disposed between fixed and free layers 626 and 628. As shown, the MTJ element is a bottom pinned MTJ element. In one embodiment, the MTJ element is a bottom pinned perpendicular MTJ element. The MTJ element may include top and bottom electrodes (not shown), such as Ta or TaN electrodes. Other types or configurations of the storage elements may also be useful. For example, the MTJ element may be a top pinned or have a horizontal magnetization direction.

Above the storage dielectric layer is a metal level of an ILD level. For example, the metal level is M2. Other metal levels may also be useful. The metal level includes metal lines disposed in a dielectric layer. The metal line and top of the dielectric layer have coplanar top surfaces. In one embodiment, a bit line (BL) is coupled to the storage element.

Although as described, the various lines and storage element are disposed in specified dielectric levels of the backend dielectric levels, other configurations may also be useful. For example, they may be disposed in other or additional metal levels. For example, the storage element may be provided in an upper via level, such as between M5 and M6. In such cases, BL may be disposed in M6. Furthermore, the device may include other device regions and components.

In one embodiment, the first and second select transistors are nTFETs. The drain region of the first select transistor is p-type and the source region of the first select transistor is n-type. In contrast, the drain region of the second select transistor is n-type and the source region of the second transistor is p-type. This results in current flowing through the first transistor from SL to BL and current flowing through the second transistor from BL to SL, as shown in FIG. 3a.

In another embodiment, the first and second select transistors are pTFETs. The drain region of the first select transistor is p-type and the source region of the first select transistor is n-type. In contrast, the drain region of the second select transistor is n-type and the source region of the second transistor is p-type. This results in current flowing through the first transistor from SL to BL and current flowing through the second transistor from BL to SL, as shown in FIG. 3b.

In another embodiment, the first select transistor is a nTFET and the second select transistor is a pTFET. The drain region of the first select transistor is p-type and the source region of the first select transistor is n-type. In contrast, the drain region of the second select transistor is n-type and the source region of the second transistor is p-type. This results in current flowing through the first transistor from SL to BL and current flowing through the second transistor from BL to SL, as shown in FIG. 3c.

In another embodiment, the first select transistor is a pTFET and the second select transistor is a nTFET. The drain region of the first select transistor is p-type and the source of the source region of the first select transistor is n-type. In contrast, the drain region of the second select transistor is n-type and the source region of the second transistor is p-type. This results in current flowing through the first transistor from SL to BL and current flowing through the second transistor from BL to SL, as shown in FIG. 3d. Other configurations of TFETs having current flow in opposite directions may also be useful.

Figure 8B:
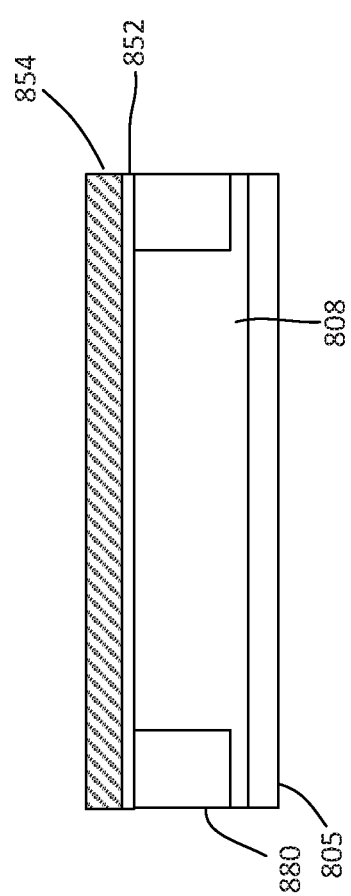
FIGS. 8a-8n show cross-sectional views of an embodiment of a process for forming a device.
Figure 8D:
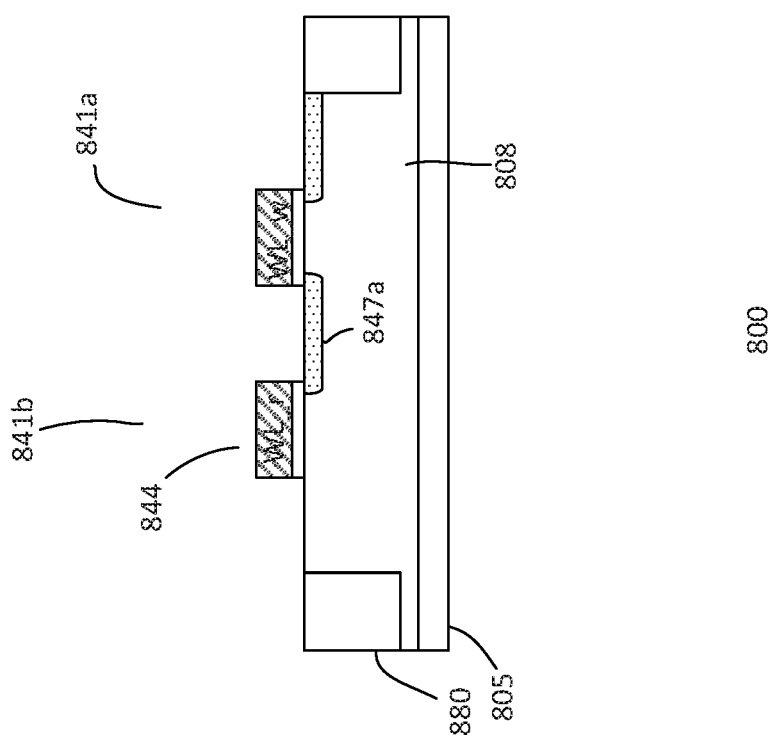
Figure 8E:
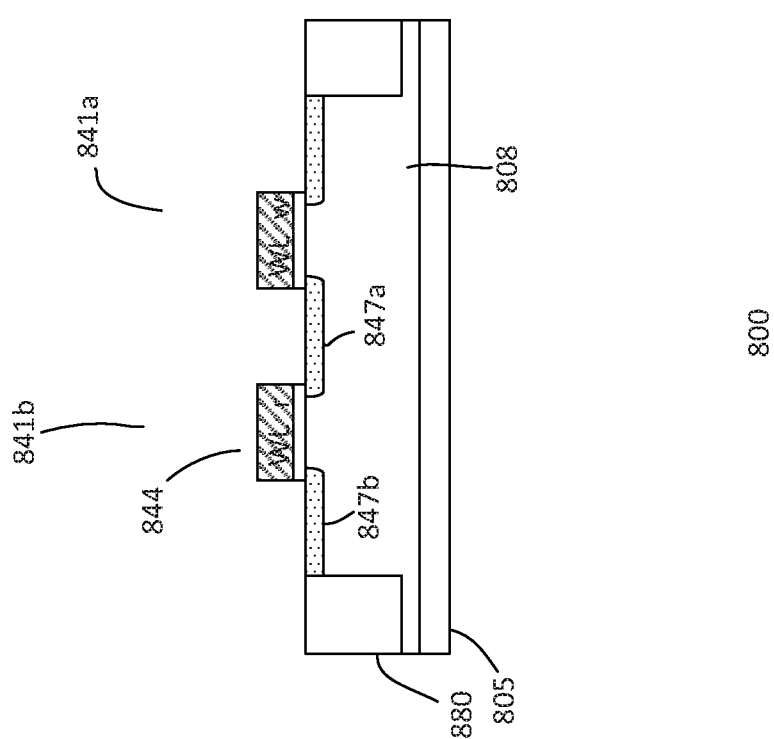
Figure 8F:
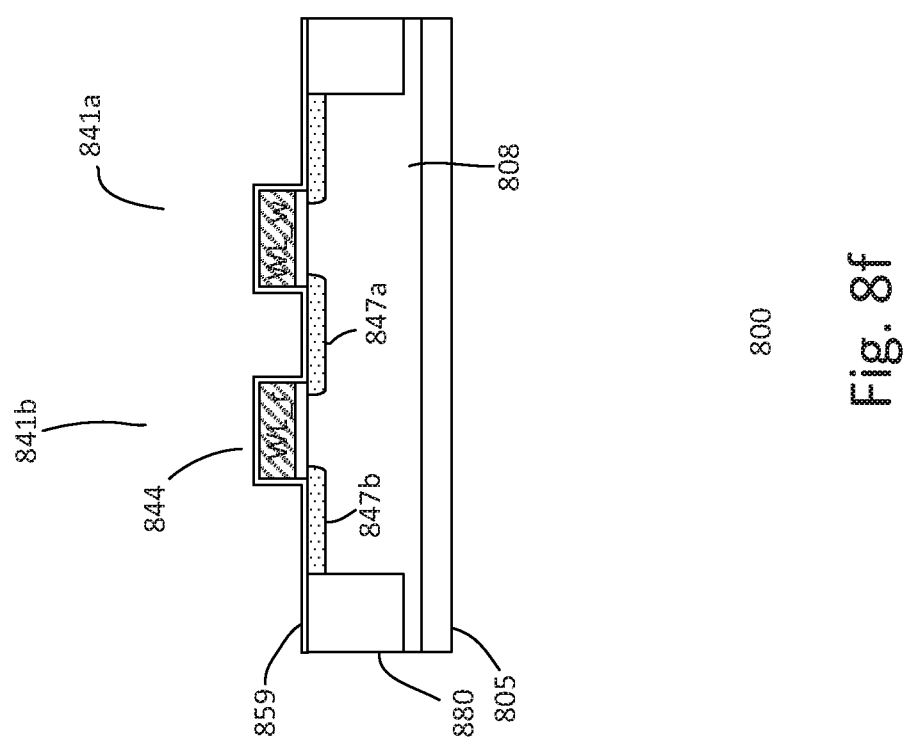
Figure 8G:
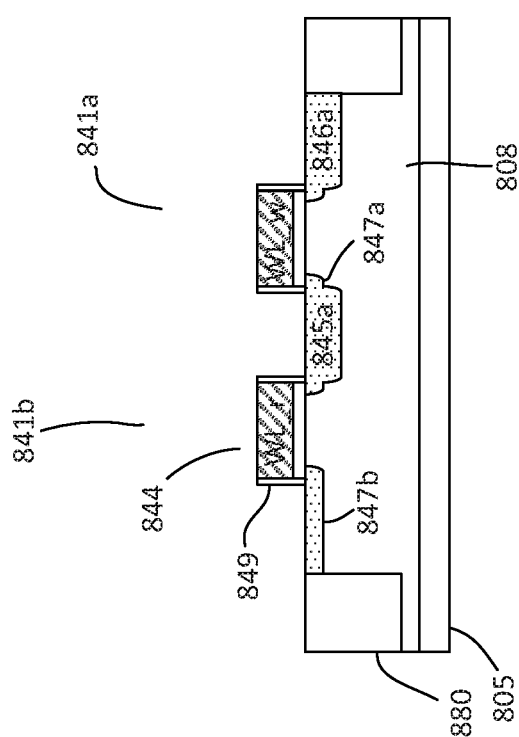
Figure 8H:
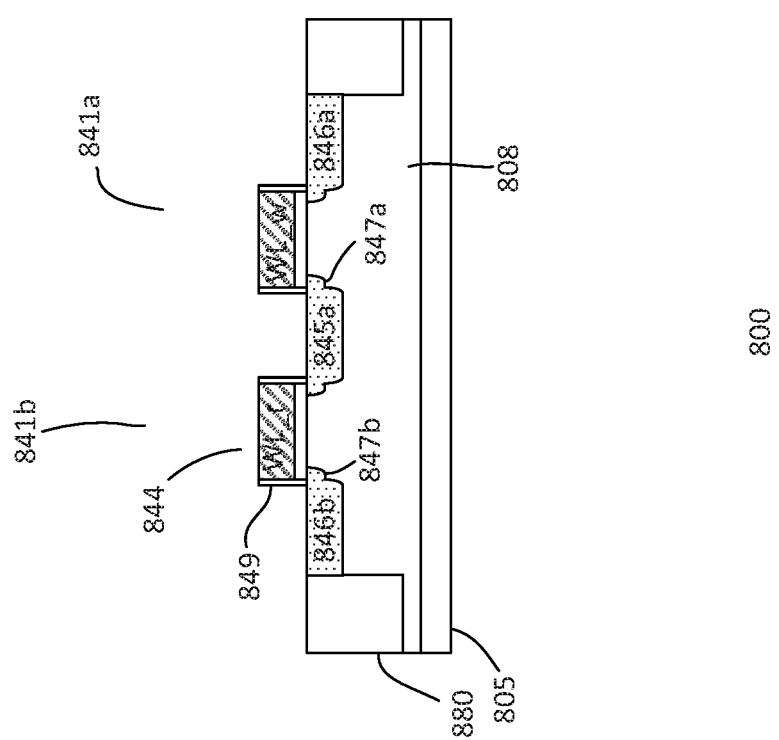
Figure 8I:
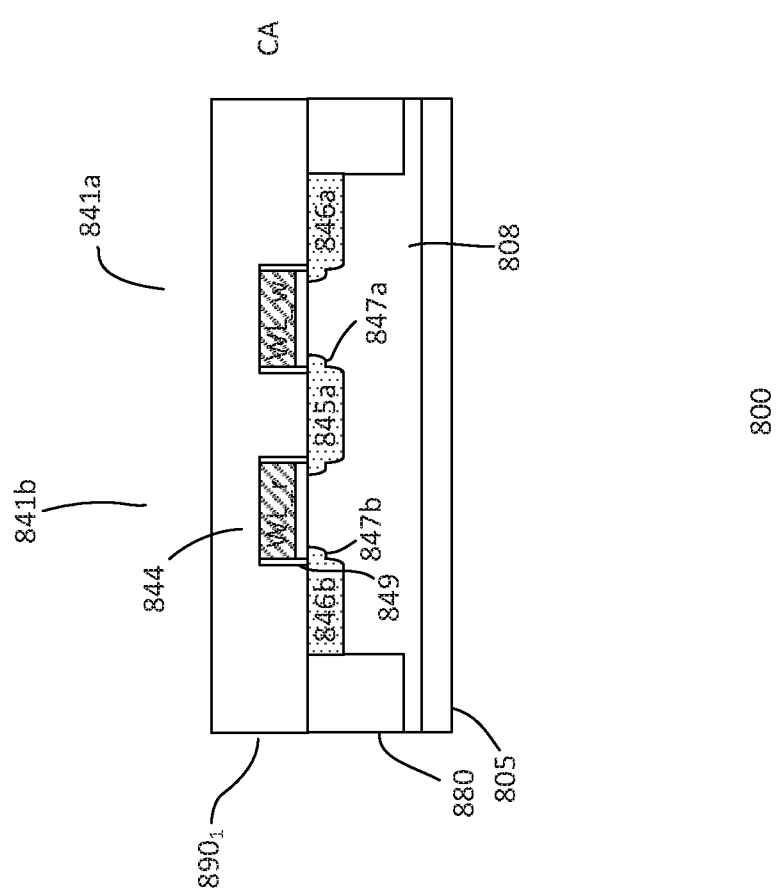
Figure 8K:
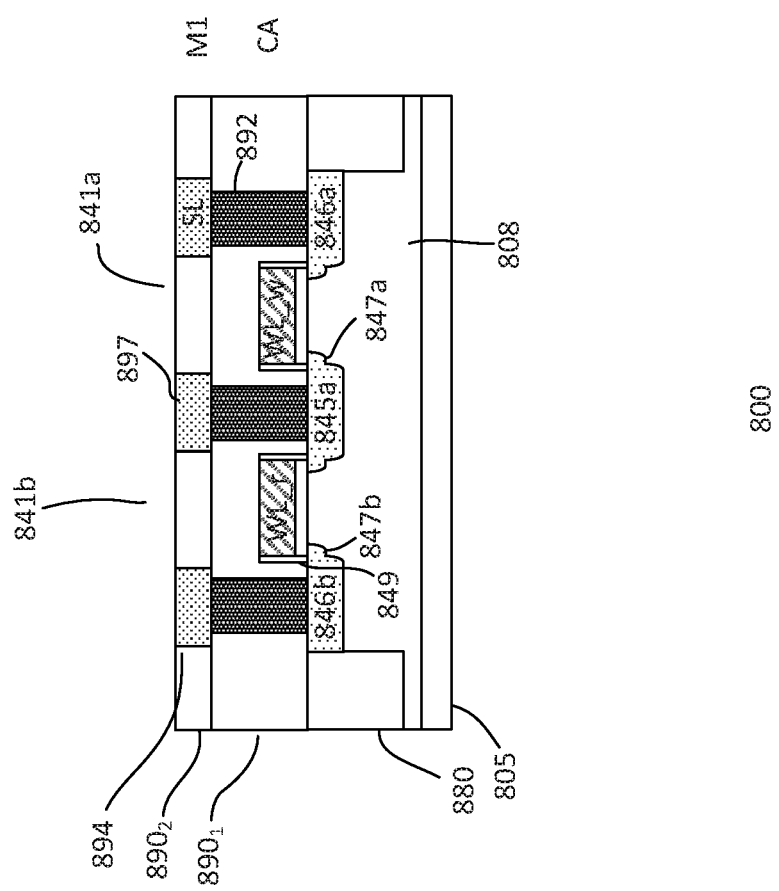
Figure 8I:
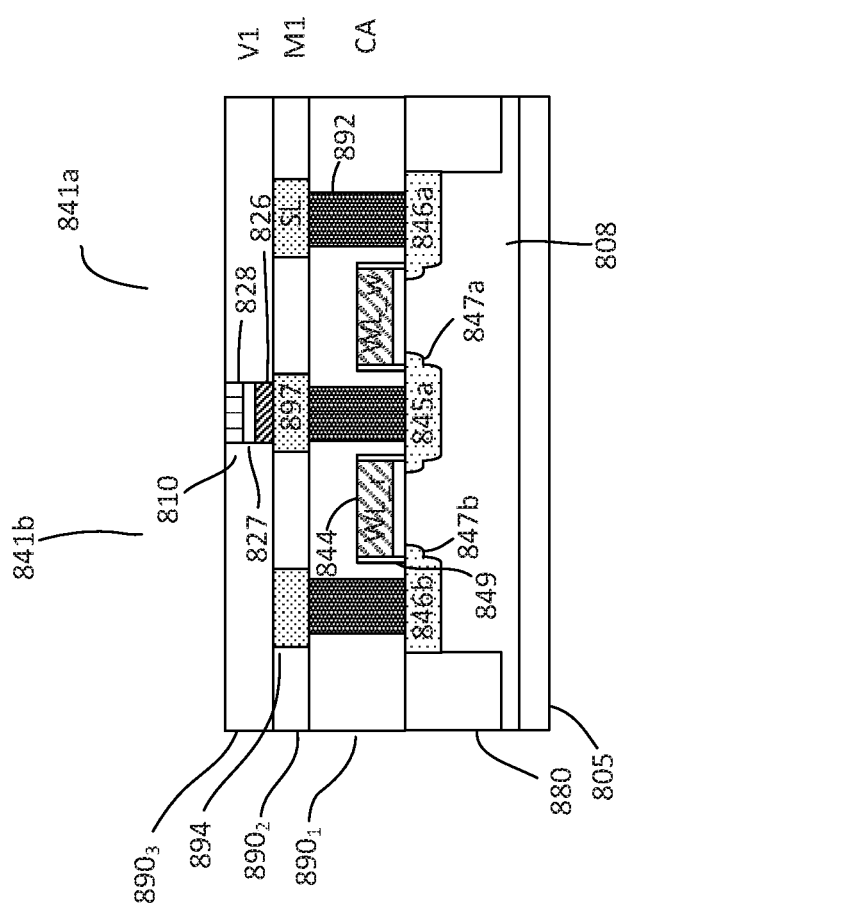
Figure 8M:
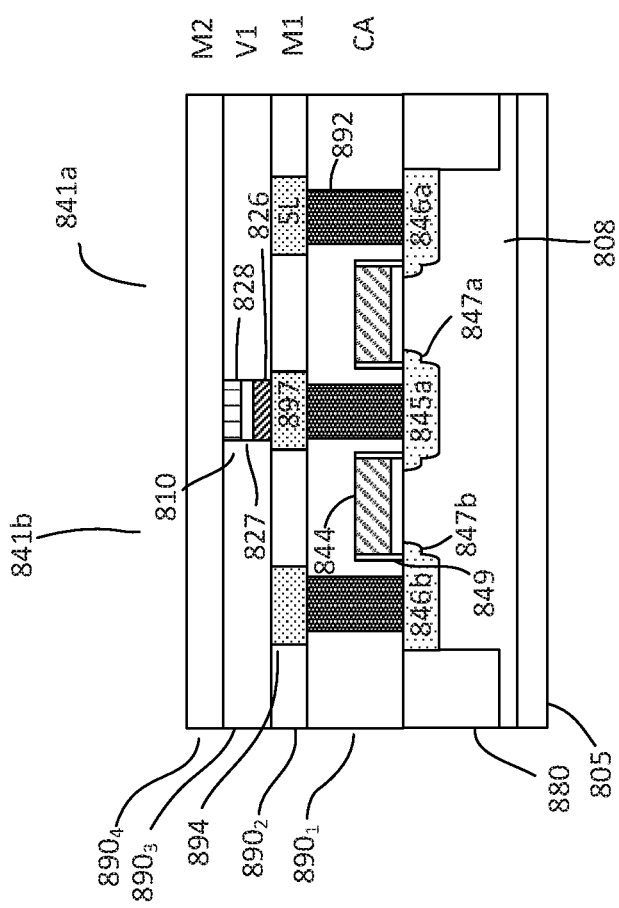
Figure 8N:
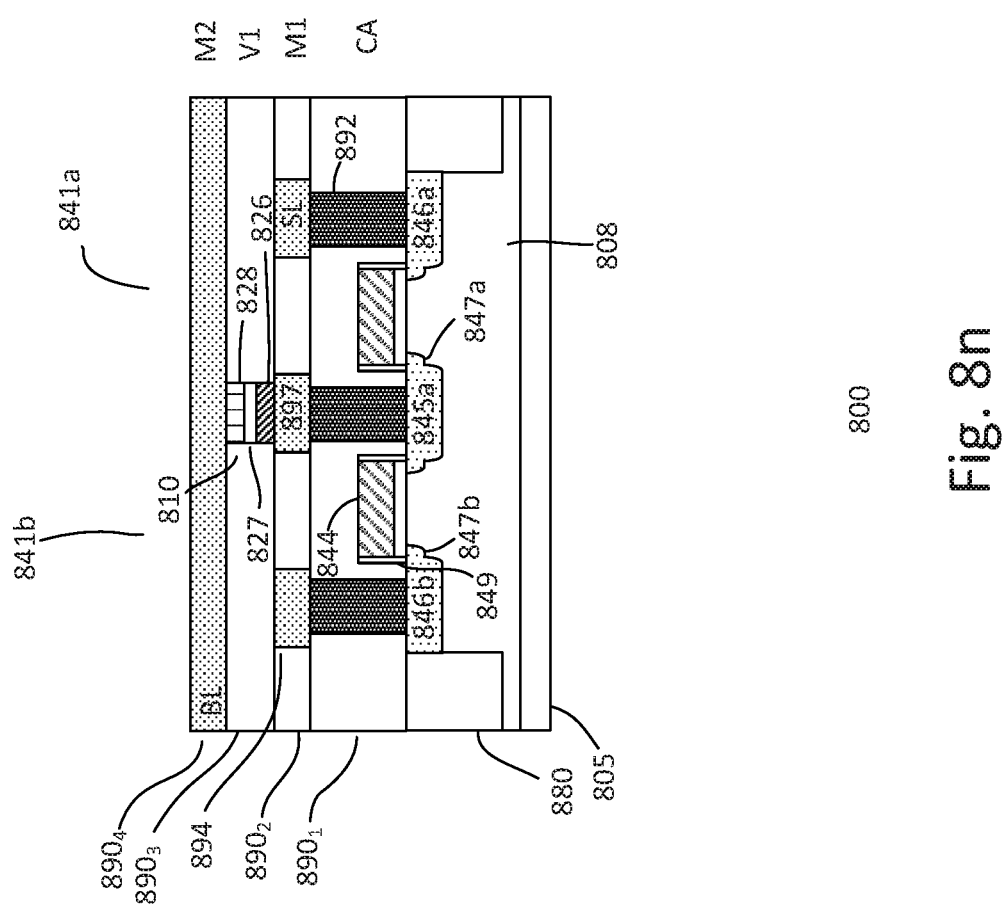

FIGS. 8a-8n show cross-sectional views of an embodiment of a process 800 for forming a device. The process includes forming a memory cell. The memory cell, for example, may be a NVM memory cell. The memory cell, in one embodiment, is a magnetoresistive NVM cell, such as a STT-MRAM cell. The memory cell, for example, is the same or similar to that described in FIG. 2a and FIGS. 6a-6b. Common elements may not be described or described in detail.

The cross-sectional views, for example, are along the bit line direction. Although the cross-sectional views show one memory cell, it is understood that the device includes a plurality of memory cells of, for example, a memory array. In one embodiment, the process of forming the STT-MRAM cell is highly compatible with CMOS logic process. For example, the STT-MRAM cell can be formed simultaneously with CMOS logic devices (not shown) on the same substrate.

Referring to FIG. 8a, a substrate 805 is provided. The substrate, for example, is a semiconductor substrate, such as a silicon substrate. For example, the substrate may be a lightly doped p-type substrate. Providing an intrinsic or other types of doped substrates, such as silicon germanium (SiGe), germanium (Ge), gallium arsenide (GaAs) or any other suitable semiconductor materials, may also be useful. In some embodiments, the substrate may be a crystalline-on-insulator (COI) substrate. A COI substrate includes a surface crystalline layer separated from a bulk crystalline by an insulator layer. The insulator layer, for example, may be formed of a dielectric insulating material. The insulator layer, for example, includes silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

The substrate is processed to define a cell region in which a memory cell is formed. The cell region may be part of an array region. For example, the array region may include a plurality of cell regions. The substrate may include other types of device regions, such as a logic region. Other types of regions may also be provided.

Isolation regions 880 are formed in the substrate. In one embodiment, the isolation regions are shallow trench isolation (STI) regions. Other types of isolation regions may also be useful. The isolation regions are provided to isolate device regions from other regions. The isolation regions may also isolate contact regions within a cell region. Isolation regions may be formed by, for example, etching trenches in the substrate and filling them with a dielectric material, such as silicon oxide. A planarization process, such as chemical mechanical polish (CMP), is performed to remove excess dielectric material, leaving, for example, STI regions isolating the device regions.

A doped well or device well 808 is formed. The well, for example, is formed after the isolation regions. In one embodiment, the well serves as a well for the select transistors of the selector unit. The well, for example, is a second polarity type doped well. The second polarity type is the opposite polarity type of the first or write selector. In one embodiment, the device well is a p-type well for a n-type write select transistor. The device well serves as an intrinsic region for a nTFET read transistor.

In one embodiment, an implant mask may be employed to implant the dopants to form the doped well. The implant mask, for example, is a patterned photoresist layer. The implant mask exposes regions of the substrate in which the second polarity wells are formed. The device well may be lightly or intermediately doped with second polarity type dopants. For example, the device well may have a dopant concentration of about 1E15 to 1E19/cm$^3$. Other dopant concentrations may also be useful. The well, for example, may be a common device well for the array.

The process may include forming other wells for other device regions. In the case where the wells are different polarity type of dopant concentration, they may be formed using separate processes, such as separate mask and implants. For example, first polarity typed doped wells, wells of different dopant concentrations as well as other wells may be formed using separate mask and implant processes.

As shown in FIG. 8*b*, gate layers are formed on the substrate. The gate layers, in one embodiment, include a gate dielectric layer 852 and a gate electrode layer 854 thereover. The gate dielectric layer, for example, may be a silicon oxide layer. The gate dielectric may be formed by thermal oxidation. As for the gate electrode layer, it may be a polysilicon layer. The gate electrode layer may be formed by chemical vapor deposition (CVD). Other suitable types of gate layers, including high k dielectric and metal gate electrode layers, or other suitable techniques for forming gate layers may also be useful.

Referring to FIG. 8*c*, the gate layers are patterned to form gates 844 of the first and second select transistors of first and second selectors 841*a* and 841*b*. Patterning the gate layers may be achieved using mask and etch techniques. For example, a soft mask, such as photoresist may be formed over the gate electrode layer. An exposure source may selectively expose the photoresist layer through a reticle containing the desired pattern. After selectively exposing the photoresist layer, it is developed to form openings corresponding to locations where the gate layers are to be removed. To improve lithographic resolution, an anti-reflective coating may be used below the photoresist layer. The patterned mask layer is used to pattern the gate layers. For example, an anisotropic etch, such as reactive ion etch (RIE), is used to remove exposed portions of the gate layers. Other types of etch processes may also be useful. The etch transfers the pattern of the mask layer to the underlying gate layers. Patterning the gate layers forms gates of the select transistors. The gates, for example, may be gate conductors along a first or word line direction. A gate conductor forms a common gate for a row of memory cells. The gate of the first transistor 841*a* serves as a WL_w while the gate of the second transistor 841*b* serves as a WL_r.

Referring to FIG. 8*d*, a first LD extension implant is performed to form LD extension regions 847*a*. The first LD extension implant is performed to form first polarity type LD extension regions. An implant mask (not shown) may be used to form the LD extension regions. To form the LD extension regions, first polarity type dopants are implanted into the substrate. The first polarity type dopants, for example, include n-type dopants. In one embodiment, the implant forms LD extension regions in the substrate adjacent to the gates. For example, the LD extension regions extend slightly under the gates. The LD extension regions, for example, include dopant concentration of about 1E18 to 5E19/cm$^3$. Other dopant concentration may also be useful. In some embodiments, a halo region may also be formed. The halo region may be formed at the same time as the LD extension region. Furthermore, the common S/D region of the select transistor may have a split halo implantation, one tailored for the MOS transistor and the other for the TFET.

In FIG. 8*e*, a second LD extension implant is performed. The second LD extension implant forms second polarity type LD extension region 847*b* for the second S/D region of the second select transistor. For example, the second LD extension implant forms the LD extension region of the source region of the nTFET read select transistor, which is the opposite polarity type as the first select MOS transistor. The second LD extension implant is formed using a mask and implant process. Although the first polarity type LD extensions are formed prior to the second polarity type LD extension regions, it is understood that the second polarity type LD extension region may be formed first. The process of forming LD extension regions may also form LD extension regions of other devices.

Referring to FIG. 8*f*, a spacer dielectric layer 859, such as silicon oxide, is formed on the substrate covering the substrate and gates. The spacer layer may be formed by CVD. Other techniques for forming the spacer layer may also be useful. An anisotropic etch, such as RIE, is performed to remove horizontal portions of the spacer layer, leaving spacers 849 to abut the sidewalls of the gates, as shown in FIG. 8*g*. It is understood that the spacer dielectric layer may include multiple layers, forming a spacer layer stack. For example, the spacer layer could include a silicon dioxide layer under a silicon nitride layer. Other configurations of spacers or spacer layers may also be useful.

After forming the spacers, a first S/D implant is performed to form first polarity type S/D regions 845*a* and 846*a*. An implant mask (not shown) may be used to form the first polarity type S/D regions in the substrate. In one embodiment, the implant forms heavily doped first polarity type S/D regions in the substrate adjacent to the gates. The first polarity type dopants, for example, include n-type dopants. The implantation process to form the first polarity type S/D regions may be performed together while forming first polarity type S/D regions in other device regions (not shown) on the same substrate. The heavily doped S/D regions, for example, have a depth deeper than the LD extension regions. The S/D regions, for example, include dopant concentration of about 5E19 to 1E21/cm$^3$. Other dopant concentration may also be useful. The first and second select transistors 841a and 841b, as shown, include a common drain region 845a formed in the substrate in between the gates.

Referring to FIG. 8h, a second S/D implant is performed to form second polarity type S/D region 846b. As shown, the second polarity type S/I) region is the source region of the TFET of the second selector. The second polarity type S/D region is formed using a separate mask and implant process. As described, the first polarity type S/D regions are formed prior to forming the second polarity type SD) region. It is understood that the second polarity type S/D regions may be formed prior to the first polarity type S/D regions. The process of forming the second polarity type S/D region may also form second polarity type S/D regions of other devices or other substrate contact regions (not shown).

In some embodiments, the source of the TFET may be formed without LD extension region. For example, the source may be formed during forming S/D regions of the same polarity type. In some instances, the source may be formed using a separate implant, such as when the LD extension region of the source is formed.

After forming the S/D regions, metal silicide contacts may be formed over the S/D regions as well as on top of the gate. The metal silicide contacts, for example, may be Ni-based silicide contacts. Other types of metal silicide contacts may also be useful. To form silicide contacts, a metal contact layer is formed on the substrate and thermally treated to create a reaction with silicon, forming metal silicide contacts. Unreacted metal is selectively removed by a wet etch, leaving metal silicide contacts on the S/D regions and gates as well as other contact regions.

Referring to FIG. 8i, a dielectric layer 890$_1$ is formed on the substrate, covering the transistors. The dielectric layer, for example, serves as a dielectric layer of an ILD layer. For example, the dielectric layer serves as a PMD or CA level of an ILD layer. The dielectric layer, for example, is a silicon oxide layer. Other types of dielectric layers may also be useful. The dielectric layer may be formed by CVD. Other techniques for forming the dielectric layer may also be useful. A planarizing process may be performed to produce a planar surface. The planarizing process, for example, may include CMP. Other types of planarizing processes may also be useful.

In one embodiment, contacts 892 are formed in the dielectric layer 890$_1$ as shown in FIG. 8j. The contacts, for example, connect to contact regions, such as S/D regions and gates of the transistors. Forming the contacts may include forming contact vias in the dielectric layer to expose the contact regions. As shown, the contacts 892 are coupled to contract regions, such as S/D regions of the transistors and gates (not shown). Forming the contact vias may be achieved using mask and etch techniques. After the vias are formed, a conductive material is deposited to fill the vias. The conductive material, for example, may be tungsten. Other types of conductive materials may also be useful. A planarization process, such as CMP, is performed to remove excess conductive material, leaving contact plugs in the contact vias.

In FIG. 8k, a dielectric layer 8902 is formed over the substrate, covering the lower dielectric layer 890$_1$. The dielectric layer, for example, serves as a metal level of an ILD layer. In one embodiment, the dielectric layer serves as M1 level of the ILD layer. The dielectric layer, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed if desired to produce a planar surface.

Conductive or metal lines 894 are formed in the dielectric layer 8902. The conductive lines may be formed by damascene technique. For example, the upper dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. In one embodiment, source lines SLs are formed to connect to the source regions 846a and 846b of the transistors while other interconnects, such as interconnect pad 897 formed in M1 is coupled to the drain region 845a. The interconnect pad may be a storage interconnect pad. Other conductive lines and pads may also be formed.

As shown in FIG. 8l, the process continues to form a storage element 810 of the memory cell. In one embodiment, the process forms an MTJ element of the memory cells. For example, various layers of MTJ stack are formed on the dielectric layer and patterned to form the MTJ element of the memory cell. Forming the storage elements may include forming the various layers of the MTJ stack on the dielectric layer 890$_2$. The layers may include materials as described in FIGS. 1a-1b and may be formed by various deposition techniques. The deposition techniques may depend on the type of layer. The layers may be patterned to form the MTJ element. Patterning the layers may be achieved using an anisotropic etch, such as RIE, with a patterned mask layer. Other techniques for forming the MTJ element may also be useful.

A storage dielectric layer 890$_3$ is formed over the MTJ element. The dielectric layer covers the storage element 810. The storage dielectric layer, for example, is a silicon oxide layer. The storage dielectric layer may be formed by, for example, CVD. Other types of storage dielectric layers or forming techniques may also be useful. A planarization process is performed to remove excess dielectric material to form a planar surface. The planarization process, for example, is CMP. The planarization process exposes the top of the storage element and provides a planar surface.

In FIG. 8m, a dielectric layer 8904 is formed over the substrate, covering the storage dielectric layer. The dielectric layer, for example, serves as a metal level of an ILD layer. In one embodiment, the dielectric layer serves as a metal level of the storage dielectric level. For example, the dielectric layer serves as M2 while the storage dielectric layer serves as V1. Other ILD levels may also be useful. The dielectric layer, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed to produce a planar surface.

As shown in FIG. 8n, a conductive or metal line is formed in the dielectric layer $890_4$ and on the storage dielectric layer $890_3$. The metal line may be formed using, for example, damascene technique. For example, BL may be formed in the dielectric layer $890_4$. This provides a connection for the storage element to BL. For example, the MTJ element 810 is coupled to the BL.

Additional processes may be performed to complete forming the device. For example, the processes may include forming additional ILD levels, pad level, passivation level, pad opening, dicing, assembly and testing. Other types of processes may also be performed.

As described, the memory cell includes a nTFET read transistor configured to flow current from BL to SL and a nMOS write select transistor. The process may be modified to form read select transistor as a nTFET configured to flow current from SL to BL, as described in FIG. 2b, or with pTFETs as described in FIGS. 2c-2d. In the case where the drain terminals of the read and write select transistors are different polarity type, an isolation region may separate them. In other cases, the write select transistor may be a pMOS transistor. For example, the device well may be a n-type device well. Other configurations of select transistors may also be useful.

In addition, metal wordlines may be provided in metal layers above the gate. The metal wordlines, for example, may be coupled to the gates of the select transistors. For example, a metal WL_w is coupled to the gate of the write select transistor and a metal line WL_r may be coupled to the gate of the read select transistor. The metal wordlines may be provided in M1 or other metal levels. For example, the metal wordlines may be parallel with the SLs. Also, as described, the various components are disposed in specific via or metal levels. It is understood that other configurations of the memory cell may also be useful. For example, the components may be disposed in other metal or via levels.

FIGS. 9a-9h show cross-sectional views of another embodiment of a process 900 for forming a device. The process includes forming a memory cell. The memory cell, for example, is the same or similar to that described in FIG. 3a and FIGS. 7a-7b. The process 900 is similar to process 800 as described in FIGS. 8a-8n. Common elements may not be described or described in detail.

The cross-sectional views, for example, are along the bit line direction. Although the cross-sectional views show one memory cell, it is understood that the device includes a plurality of memory cells of, for example, a memory array. In one embodiment, the process of forming the STT-MRAM cell is highly compatible with CMOS logic process. For example, the STT-MRAM cell can be formed simultaneously with CMOS logic devices (not shown) on the same substrate.

Figure 9A:
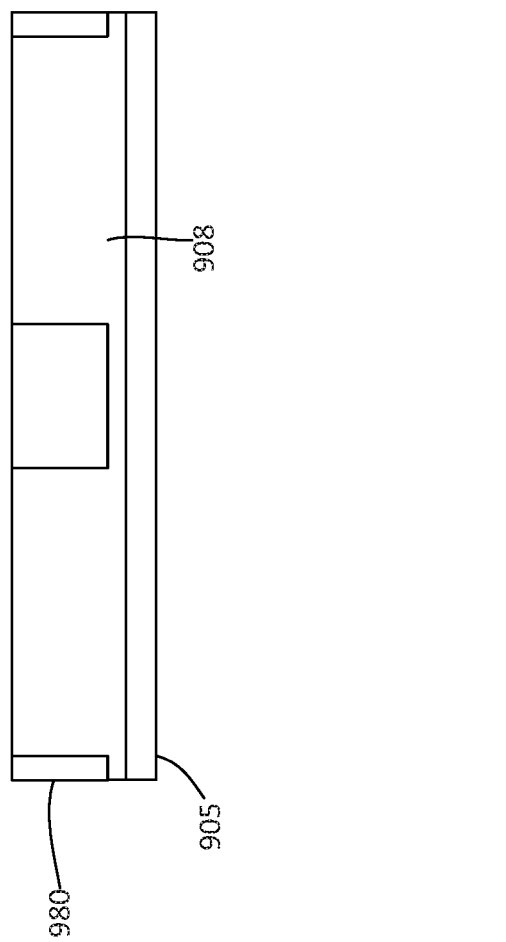

Referring to FIG. 9a, a substrate 905 is provided. The substrate, for example, is a semiconductor substrate, such as a lightly p-doped silicon substrate. Providing other types of substrates, including COI substrates, may also be useful.

The substrate is processed to define a cell region in which a memory cell is formed. The cell region may be part of an array region. For example, the array region may include a plurality of cell regions. The substrate may include other types of device regions, such as a logic region. Other types of regions may also be provided.

Isolation regions 980 are formed in the substrate. In one embodiment, the isolation regions are shallow trench isolation (STI) regions. Other types of isolation regions may also be useful. The isolation regions are provided to isolate device regions from other regions. The isolation regions may also isolate contact regions within a cell region.

A doped well or device well 908 is formed. The well, for example, is formed after the isolation regions. The device well may be a continuous well for the entire memory array. The device well may be a lightly doped well and serves as an intrinsic region for TFETs of the first and second selectors. The device well may be lightly or intermediately doped with first or second polarity type dopants. The device well may have a dopant concentration of about 1E15 to $1E19/cm^3$. Other suitable dopant concentrations may also be useful.

In one embodiment, an implant mask may be employed to implant the dopants to form the device well. The implant mask, for example, is a patterned photoresist layer. The implant mask exposes regions of the substrate in which the second polarity wells are formed. The process may include forming other wells for other device regions. In the case where the wells are different polarity type of dopant concentration, they may be formed using separate processes, such as separate mask and implants. For example, first polarity typed doped wells, wells of different dopant concentrations as well as other wells may be formed using separate mask and implant processes.

Figure 9B:
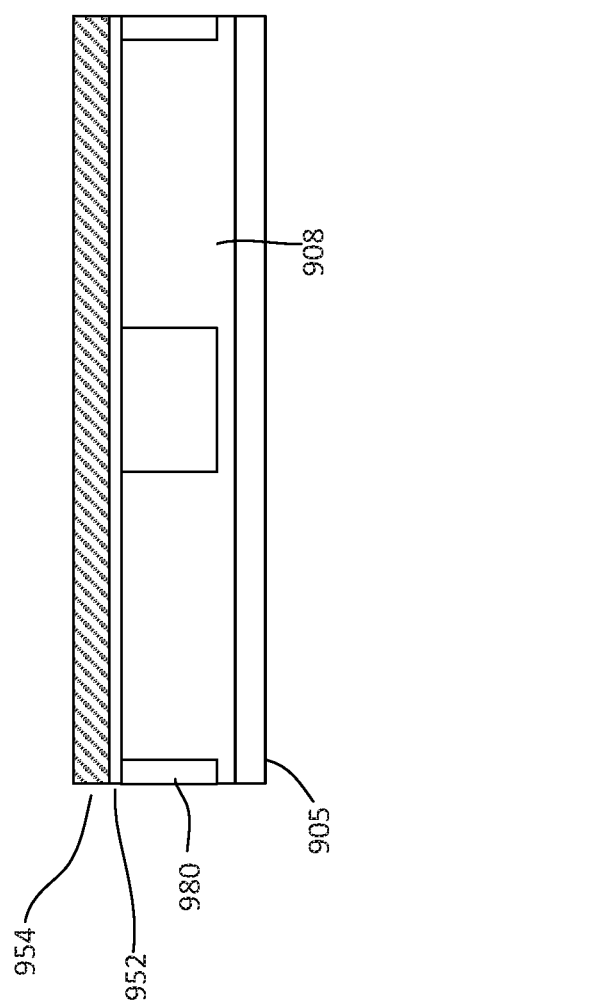

Referring to FIG. 9b, gate layers are formed on the substrate. The gate layers, in one embodiment, include a gate dielectric layer 952 and a gate electrode layer 954 thereover. The gate dielectric layer, for example, may be a silicon oxide layer. The gate dielectric may be formed by thermal oxidation. As for the gate electrode layer, it may be a polysilicon layer. The gate electrode layer may be formed by chemical vapor deposition (CVD). Other suitable types of gate layers, including high k dielectric and metal gate electrode layers, or other suitable techniques for forming gate layers may also be useful.

Figure 9C:
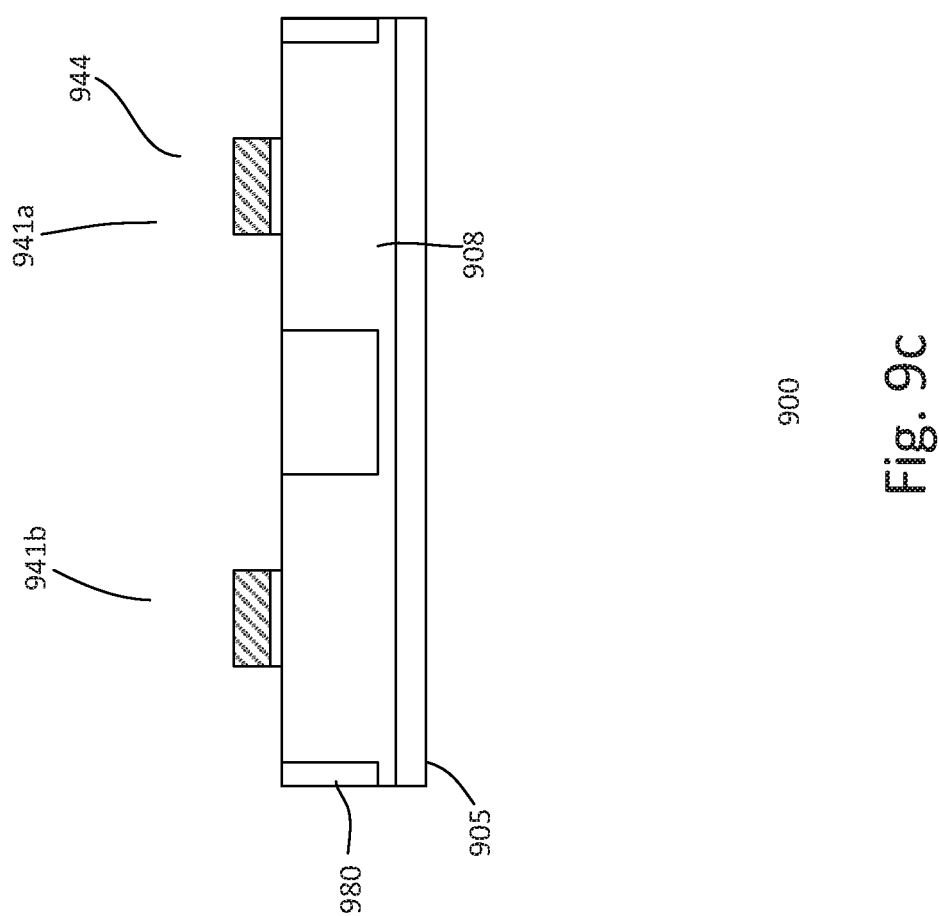

Referring to FIG. 9c, the gate layers are patterned to form gates 944 of the first and second select transistors of first and second selectors 941a and 941b. Patterning the gate layers may be achieved using mask and etch techniques. The gates, for example, may be gate conductors along a first or word line direction. A gate conductor forms a common gate for a row of memory cells. The gates of the transistors serve as first and second WL_r/w. The WL_r/w may be a common WL_r/w. For example, the pattern of the gates may include interconnections. Providing separate gates with separate control signals may also be useful.

Referring to FIG. 9d, a first LD extension implant is performed to form first LD extension regions 947a. The first LD extension implant is performed to form, for example, first polarity type LD extension regions for first polarity type S/D regions of the select transistors. The first polarity type, in one embodiment, is n-type. For example, n-type LD extension regions for the source region of the first select transistor and for the drain region of the second select transistor are formed. An implant mask (not shown) may be used to form the LD extension regions. The LD extension regions, for example, may have a dopant concentration of about 1E18 to $2E20/cm^3$. Other dopant concentration may also be useful.

Figure 9E:
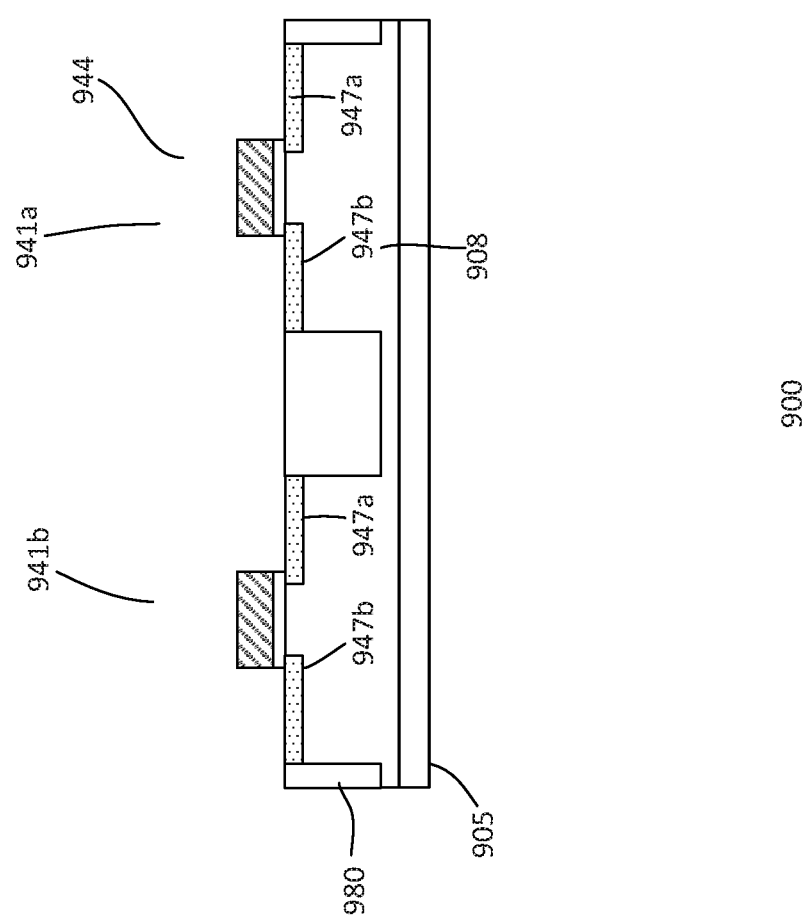

In FIG. 9e, a second LD extension implant is performed. The second LD extension implant forms second type LD extension regions 947b for the second polarity type S/D regions of the select transistors. For example, p-type extension regions are formed for p-type SI) regions of the select transistors. For example, p-type LD extension regions for the drain region of the first select transistor and for the source region of the second select transistor are formed. The second LD extension implant is formed using a mask and implant process. Although the first polarity type LD extension regions, as described, are formed prior to the second polarity type LD extension regions, it is understood that the second polarity type LD extension regions may be formed first. The process of forming LD extension regions may also form LD extension regions of other devices.

The TFETs of the selectors are configured to have current flow in opposite directions. For example, one TFET has current flowing from the BL to SL while the other TFET has current flowing from SL to BL. In one embodiment, the drain regions of first and second selectors are configured to have opposite polarity type dopants; the source regions of the first and second selectors are configured to have opposite polarity type dopants. Such a configuration results in opposite current flow in the select transistors. Since the drain regions of the select transistors are coupled to the storage unit, they are configured to be adjacent to each other and separated by an isolation region.

Figure 9F:
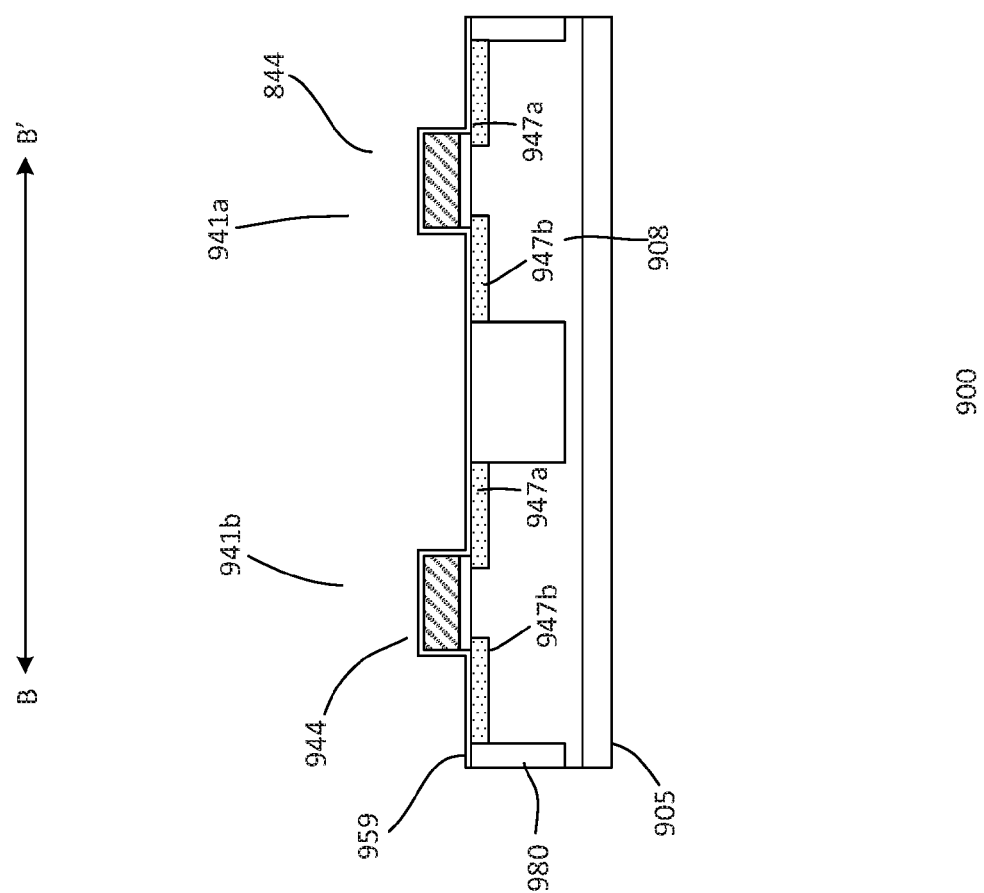
Figure 9G:
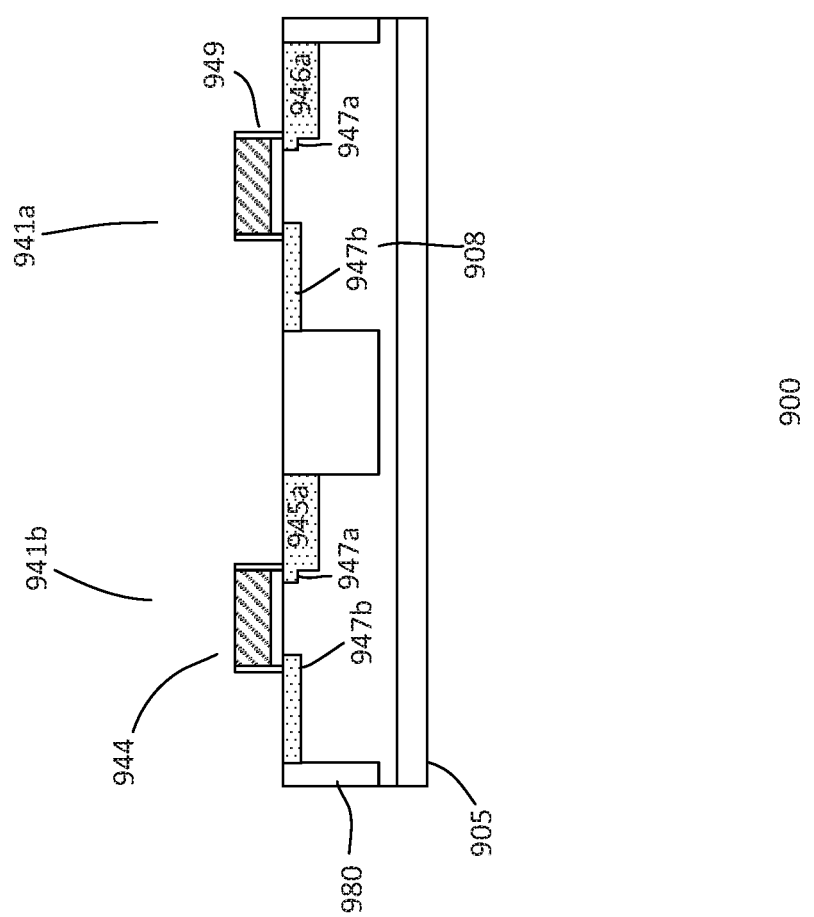

Referring to FIG. 9f, a spacer dielectric layer 959, such as silicon oxide, is formed on the substrate covering the substrate and gates. The spacer layer may be formed by CVD. Other techniques for forming the spacer layer may also be useful. An anisotropic etch, such as RIE, is performed to remove horizontal portions of the spacer layer, leaving spacers 949 to abut the sidewalls of the gates, as shown in FIG. 9g.

After forming the spacers, a first S/D implant is performed to form first polarity type S/D regions 945a and 946a. For example, n-type S/D regions are formed. An implant mask (not shown) may be used to form the first polarity type STD) regions in the substrate. The implantation process to form the first polarity type S/D regions may be performed together while forming first polarity type S/D regions in other device regions (not shown) on the same substrate. The heavily doped S/i) regions, for example, have a depth deeper than the LD extension regions. The S/D regions, for example, include dopant concentration of about 5E19 to 1E21/cm$^3$. Other dopant concentration may also be useful.

Figure 9H:
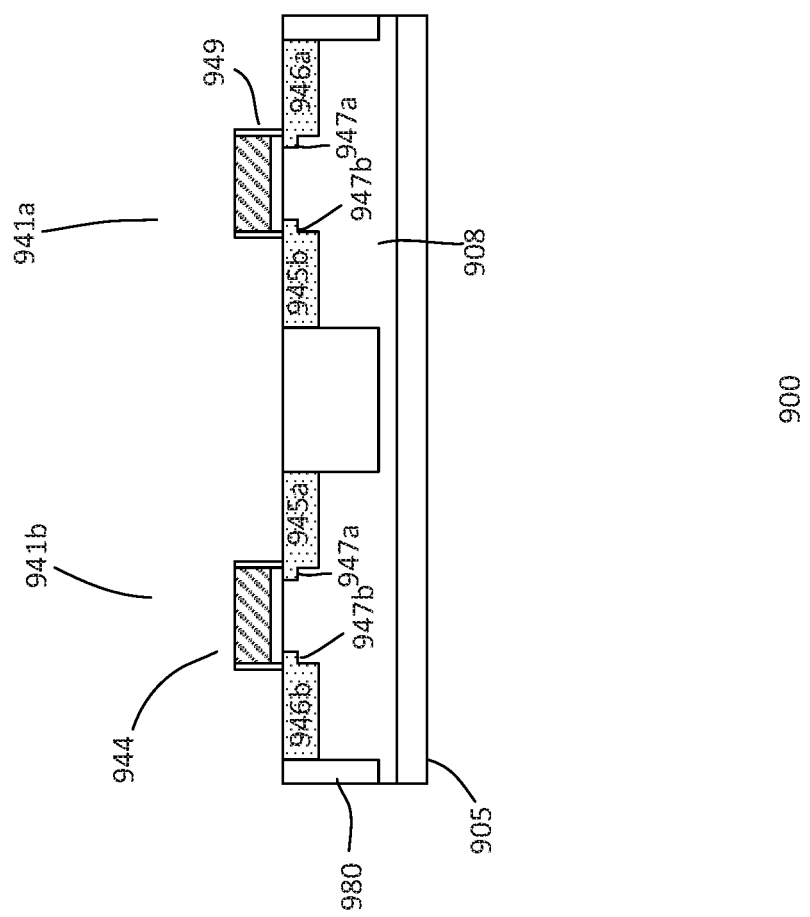

Referring to FIG. 9h, a second S/D implant is performed to form second polarity type S/D region 945b and 946b. As shown, the second polarity type S/D regions include the source region of the TFET of the second selector and the drain region of the TFET of the first selector. The second polarity type S/D region is formed using a separate mask and implant process. As described, the first polarity type S/D regions are formed prior to forming the second polarity type S/D regions. It is understood that the second polarity type S/D regions may be formed prior to the first polarity type S/D regions. The process of forming S/D regions may also form S/D regions of other devices or other substrate contact regions (not shown).

After forming S/D regions, metal silicide contacts may be formed over the S/D regions as well as on top of the gate. The metal silicide contacts, for example, may be Ni-based silicide contacts. Other types of metal silicide contacts may also be useful. To form silicide contacts, a metal contact layer is formed on the substrate and thermally treated to create a reaction with silicon, forming metal silicide contacts. Unreacted metal is selectively removed by a wet etch, leaving metal silicide contacts on the S/D regions and gates. The process continues as described from FIGS. 8i-8n.

As described, the first and second cell select transistors are nTFETs, with the first nTFET configured to flow current from SL to BL and the second nTFET to flow current from BL to SL, as described in FIG. 3a. The process may be modified to form first and second pTFETs, as described in FIG. 3b or one nTFET and the other a pTFET, as described in FIGS. 3c-3d. Other configurations of select transistors may also be useful.

Additional processes may be performed to complete forming the device. For example, the processes may include forming additional ILD levels, pad level, passivation level, pad opening, dicing, assembly and testing. Other types of processes may also be performed.

In addition, metal wordlines may be provided in metal levels above the gate. The metal wordlines, for example, may be coupled to the gates of the select transistors. For example, a metal line WL_r/w may be provided to couple to the gates of the select transistors. The metal wordline may be provided in M1 or other metal levels. For example, the metal wordline may be parallel with the SLs. Also, as described, the various components are disposed in specific via or metal levels. It is understood that other configurations of the memory cell may also be useful. For example, the components may be disposed in other metal or via levels.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A memory cell comprising:
   a storage unit, the storage unit comprises
      a magnetic storage element with first and second storage terminals;
      a bitline coupled to the second storage terminal;
   a selector unit, the selector unit comprises
      a first selector having a first select transistor having a first drain terminal, a first source terminal and a first control terminal, wherein
         the first drain terminal is coupled to the first storage terminal,
         the first source terminal is coupled to a source line,
         the first control terminal is coupled to a first control wordline,
      a second selector comprises a second select transistor which is a second tunneling select transistor having a second drain terminal, a second source terminal and a second control terminal, wherein
         the second drain terminal is coupled to the first storage terminal,
         the second source terminal is coupled to the source line,
         the second control terminal is coupled to a second control wordline,
         the second tunneling select transistor is configured to have a second unidirectional current flow between the second source and second drain terminals, wherein the second selector serves at least as a read selector for read operations of the memory cell and a read current is in the direction of the second unidirectional current flow between the second source and second drain terminals.

2. The memory cell of claim 1 wherein the first select transistor comprises a metal oxide semiconductor (MOS) transistor having first bi-directional current flow between the first source and first drain terminals.

3. The memory cell of claim 2 wherein the first and second select transistors are the same polarity type.

4. The memory cell of claim 2 wherein the first and second select transistors are of the opposite polarity type.

5. The memory cell of claim 2 wherein the first select transistor is employed to perform a write operation.

6. The memory cell of claim 2 wherein the first select transistor is employed to perform a write operation when a write current is in an opposite direction than the second unidirectional current flow.

7. The memory cell of claim 2 wherein the second select transistor is employed to perform a write operation when a write current is along the second unidirectional current flow to augment the write current of the first select transistor.

8. The memory cell of claim 2 wherein the second select transistor is employed to perform a write operation when a write current is along the second unidirectional current flow.

9. The memory cell of claim 1 wherein:
the first select transistor comprises a first tunneling transistor having a first unidirectional current flow between the first source and first drain terminals; and
the first tunneling transistor and the second tunneling transistor are configured to have first and second unidirectional current flows between drain and source terminals, wherein the first and second unidirectional current flows are in opposite directions between the source and drain terminals.

10. The memory cell of claim 9 wherein the first and second tunneling transistors are of the same polarity type.

11. The memory cell of claim 9 wherein the first and second tunneling transistors are of the opposite polarity type.

12. The memory cell of claim 9 wherein:
the first tunneling transistor is used perform a write operation when write current matches the first unidirectional current flow; and
the second tunneling transistor is used to perform the write operation when write current matches the second unidirectional current flow.

13. The memory cell of claim 12 wherein one of first and second tunneling transistors whose unidirectional current flow matches a desired read current direction is used to perform a read operation.

14. The memory cell of claim 9 wherein the first and second control wordlines are coupled together to form a common control wordline.

15. A method of forming a device comprising:
providing a substrate, the substrate defined with a cell region;
forming a selector unit in the cell region, wherein forming the selector unit comprises forming first and second transistors of the selector unit in the cell region, wherein
the first selector is a first select transistor having a first drain region, a first source region and a first gate,
the second selector is a second select transistor which is a second tunneling select transistor having a second drain region, a second source region and a second gate, wherein
the second tunneling select transistor is configured to have a second unidirectional current flow between the second source region and second drain region, wherein the second selector serves at least as a read selector for read operations of a memory cell and the read current is in the direction of the second unidirectional current flow between the second source region and second drain region;
forming a storage unit in a backend dielectric layer, wherein forming the storage unit comprises
forming a magnetic storage element with first and second storage terminals, the first storage terminal is electrically coupled to the first and second drain regions;
forming source lines in the backend dielectric layer coupled to the first and second source regions;
forming a first control signal coupled to the first gate and a second control signal coupled to the second gate; and
forming a bitline in the backend dielectric layer, wherein the bitline is coupled to the second storage terminal.

16. The method of claim 15 wherein forming the first select transistor comprises forming a first MOS transistor, wherein the first select transistor comprises a first bi-directional current flow.

17. The method of claim 16 wherein the second select transistor additionally serves as a write transistor when a write current of the write operation matches the second unidirectional current flow.

18. The method of claim 15 wherein forming the first select transistor comprises forming a first tunneling transistor, the first tunneling transistor is configured to have a first unidirectional current flow between the first drain and source regions, wherein the first and second unidirectional current flows are in opposite directions between the source and drain regions.

19. The method of claim 18 wherein forming the first and second control signals comprises forming a common control signal coupled to the first and second gates.

20. A method of forming a device comprising:
providing a substrate, the substrate defined with a cell region;
forming a selector unit in the cell region, wherein forming the selector unit comprises forming first and second transistors of the selector unit in the cell region, wherein
the first selector is a first select transistor which is a first tunneling transistor having a first drain region, a first source region and a first gate, wherein
the first tunneling select transistor is configured to have a first unidirectional current flow between the first source region and first drain region,
the second selector is a second select transistor which is a second tunneling select transistor having a second drain region, a second source region and a second gate, wherein
the second tunneling select transistor is configured to have a second unidirectional current flow between the second source region and second drain region, wherein the second unidirectional current flow is in an opposite direction between the source region and drain region than the first unidirectional current flow;
forming a storage unit in a backend dielectric layer, wherein forming the storage unit comprises
forming a magnetic storage element with first and second storage terminals,
the first storage terminal is electrically coupled to the first and second drain regions;
forming source lines in the backend dielectric layer coupled to the first and second source regions;
forming a first control signal coupled to the first gate and a second control signal coupled to the second gate; and
forming a bitline in the backend dielectric layer, wherein the bitline is coupled to the second storage terminal.

* * * * *